(12) United States Patent
Watanabe et al.

(10) Patent No.: US 10,825,664 B2
(45) Date of Patent: Nov. 3, 2020

(54) WAFER PROCESSING METHOD AND WAFER PROCESSING APPARATUS

(71) Applicant: HITACHI HIGH-TECH CORPORATION, Tokyo (JP)

(72) Inventors: Tomoyuki Watanabe, Tokyo (JP); Yutaka Kouzuma, Tokyo (JP); Takumi Tandou, Tokyo (JP); Kenetsu Yokogawa, Tokyo (JP); Hiroshi Ito, Tokyo (JP)

(73) Assignee: HITACHI HIGH-TECH CORPORATION, Tokyo (JP)

( * ) Notice: Subject to any disclaimer, the term of this patent is extended or adjusted under 35 U.S.C. 154(b) by 0 days.

(21) Appl. No.: 16/110,081

(22) Filed: Aug. 23, 2018

(65) Prior Publication Data

US 2019/0198299 A1 Jun. 27, 2019

(30) Foreign Application Priority Data

Dec. 27, 2017 (JP) ................................. 2017-251101

(51) Int. Cl.
*H01J 37/32* (2006.01)
*H01L 21/683* (2006.01)
(Continued)

(52) U.S. Cl.
CPC ...... *H01J 37/32724* (2013.01); *H01J 37/321* (2013.01); *H01J 37/32449* (2013.01); *H01L 21/67069* (2013.01); *H01L 21/67109* (2013.01); *H01L 21/67115* (2013.01); *H01L 21/67248* (2013.01); *H01L 21/6831* (2013.01); *H01L 21/6833* (2013.01); *H01L 21/68735* (2013.01);
(Continued)

(58) Field of Classification Search
None
See application file for complete search history.

(56) References Cited

U.S. PATENT DOCUMENTS 5,979,475 A 11/1999 Satoh et al.
2010/0024982 A1* 2/2010 Wallace ............ H01L 21/67109
156/345.27

(Continued)

FOREIGN PATENT DOCUMENTS

| JP | 8-264626 A | 10/1996 |
|----|----|----|
| JP | 2015-008249 A | 1/2015 |
| JP | 2017-183700 A | 10/2017 |

*Primary Examiner* — Roberts P Culbert
(74) *Attorney, Agent, or Firm* — Miles & Stockbridge, P.C.

(57) ABSTRACT

Provided is a plasma processing apparatus including: a processing chamber; a sample stage placed inside the processing chamber; a processing gas supply unit which supplies processing gas into the processing chamber; a high-frequency power supply which supplies an electric field inside the processing chamber; an electrostatic chuck unit disposed on the sample stage in which openings to flow heat transfer gas are formed; a refrigerant supply unit which supplies a refrigerant inside the sample stage; and a control unit, wherein the control unit controls a heat transfer gas supply unit to control the temperature of a wafer depending on a plurality of processes for processing the wafer by switching a flow rate of the heat transfer gas or the type of the heat transfer gas flowing out of the openings between a concave portion formed in the electrostatic chuck unit and the wafer attracted to the electrostatic chuck unit.

5 Claims, 18 Drawing Sheets

(51) Int. Cl.
  *H01L 21/67* (2006.01)
  *H01L 21/687* (2006.01)
  *H01L 21/66* (2006.01)
(52) U.S. Cl.
  CPC .. *H01L 21/68742* (2013.01); *H01J 37/32963* (2013.01); *H01J 2237/002* (2013.01); *H01J 2237/3341* (2013.01); *H01L 22/26* (2013.01)

(56) References Cited

U.S. PATENT DOCUMENTS

| | | | |
|---|---|---|---|
| 2015/0004794 A1 | 1/2015 | Harada | |
| 2015/0270148 A1* | 9/2015 | Shinoda | H01J 37/32724 |
| | | | 156/345.35 |
| 2017/0278730 A1* | 9/2017 | Tandou | H01L 21/67248 |

* cited by examiner

WAFER PROCESSING METHOD AND WAFER PROCESSING APPARATUS

CLAIM OF PRIORITY

The present application claims priority from Japanese Patent Application JP 2017-251101 filed on Dec. 27, 2017, the content of which is hereby incorporated by reference into this application.

BACKGROUND OF THE INVENTION

The present invention relates a wafer processing method and a processing apparatus for processing a film layer to be processed in a processing chamber which is formed in advance on a surface of a sample to be processed such as a semiconductor wafer disposed in the processing chamber inside a vacuum chamber, and more particularly, to a wafer processing method and a wafer processing apparatus for processing a substrate-like sample such as a semiconductor wafer, while placing the substrate-like sample on a sample stage disposed in the processing chamber.

In recent years, in manufacturing a semiconductor device in which a process such as etching is performed on a film layer disposed on a surface of a semiconductor wafer to form a circuit structure, it is required to achieve processing conditions such as different temperatures on a substrate-like sample such as a wafer in each of a plurality of processes on the film layer to be processed, and continuously perform these plural processes, while holding a substrate-like sample such as a wafer in a processing chamber inside the processing apparatus. In such a process, when the values of the temperatures of the processes achieved by the plurality of processes performed before and after the process are largely different from each other, there was a problem in which the back side of the wafer and the electrostatic chuck slide due to thermal expansion difference between the wafer as the sample and the electrostatic chuck for holding the wafer, dust and defects occur to generate particles, and such particles adhere to the film structure including the film layer to be processed on the wafer surface and are contaminated.

As a technique for solving this problem, techniques for preventing generation of particles have been developed. As an example of such a technique in the related art, one disclosed in JP-A-2015-8249 has been known.

The related art discloses a processing method of effectively preventing the generation of the particles, by performing a step in which plasma is formed in the processing chamber in a state of controlling the electrostatic chuck with temperature adjustable in the processing chamber to a first temperature, the sample held on the electrostatic chuck is processed, and the temperature of the electrostatic chuck is controlled to a second temperature lower than the first temperature in a stepwise manner, and a purging step of purging the inside of the processing chamber after the processing by the plasma with the inert gas.

In this technique, the difference in thermal expansion during temperature lowering is prevented, and generation of particles is effectively prevented. Further, it is disclosed that by performing the temperature lowering step and the purging step in parallel, the generated particles can be immediately exhausted from the inside of the processing chamber to the outside and the number of particles can be reduced.

On the other hand, in the related art, although the total amount of sliding between the back side of the wafer and the upper side of the electrostatic chuck can be reduced, there is a problem in which, when the processed wafer is carried out from the processing chamber, particles adhering to the back side of the wafer caused by the sliding between the wafer and the electrostatic chuck due to the difference in temperature in the processing step are carried out from the processing chamber, are separated from the wafer from the wafer on the transport route until it is carried to a target location and adhere to the surface of the member constituting the transport route, and thereafter, the particles adhere to another wafer when another wafer is transported in the transport route adheres.

Further, in the related art, since the upper side of the electrostatic chuck and the back side of the wafer are in contact with each other, it is not possible to prevent wear of any one of them due to cumulative contact and the change in the surface shape, the heat transfer or the adsorption characteristics of the members constituting the placing surface of the wafer on the electrostatic chuck with the lapse of time due to aging. For this reason, there is a problem that yield of processing of the wafer is impaired due to such temporal change.

In response to such a problem, JP-A-8-264626 discloses a technique in which a fluid is caused to flow between a sample to be held and a sample holding surface opposed to the sample, and the sample is held non-contact above the sample holding surface by utilizing the Bernoulli effect generated in the flow of the fluid. In this technique, the contact between the sample holding surface and the back side of the sample is substantially prevented. Furthermore, the sample holding surface of this prior art has a configuration in which the size of the region surrounded by the boundary formed on the sample holding surface on which the magnitude of the tension acting between the outer circumferential edge of the held sample and the sample holding surface abruptly changes is almost the same as the size of the sample in the direction in which the displacing of the sample with respect to the sample holding surface should be prevented.

Also, when the fluid is gas, the sample holding surface of the holder is charged by the flow of the gas, causing an attractive force due to static electricity between the sample holding surface and the sample to prevent horizontal movement and displacing of the sample above the sample holding surface, and it is possible to achieve the non-contact holding in which the position of the sample on the sample holding surface is stabilized by electric power supplied to an electrode, by disposing the electrode for generating an electrostatic attractive force on the sample holding surface.

Furthermore, JP-A-2017-183700 discloses a plasma processing apparatus and a plasma processing method in which a sample stage for placing a sample to be processed is included in the plasma processing apparatus, an electrostatic adsorption film in which a conductor is covered with an insulator, and heat transfer gas supply passages installed in at least three points are provided on the surface of the sample stage, a ring-shaped convex shape is formed on the surface of the sample stage on the outer circumferential side of the heat transfer gas supply passage, an insulator for limiting the radial movement range of the sample to be processed is provided on the outer periphery of the sample to be processed, and by controlling the electrostatic attractive force and the supply pressure of the heat transfer gas, the back side of the sample to be processed and the sample stage surface are held in a non-contact manner, and plasma treatment is carried out, while adjusting the temperature of the sample to be processed and while rotating the sample to be processed.

However, in the above-mentioned technique of the related art, since consideration was insufficient in the following points, a problem arises.

That is, in JP-A-2015-8249, as described above, there is a problem in which, when the processed wafer is carried out from the processing chamber, particles adhering to the back surface of the wafer caused by the sliding between the wafer and the electrostatic chuck due to the difference in temperature in the processing step are separated from the wafer and adhere to the surface of the member constituting the transport route on the transport route until the wafer is carried out from the processing chamber and carried into the target location until the wafer is carried out from the processing chamber to the target position, and thereafter, the particles adhere to the other wafer to contaminate when the other wafer is transported on the transport path. Further, there is a problem in which the yield of processing is impaired, by wear due to contact between the upper side of the electrostatic chuck and the back side of the wafer, and changes in the surface shape, heat transferring or adsorption characteristics of the members constituting the wafer placing surface on the electrostatic chuck over time.

On the other hand, in JP-A-8-264626, it is not taken into consideration sufficiently in application to a plasma processing apparatus that processes a sample under reduced pressure using plasma, and there was a problem that efficient processing cannot be performed. That is, in order to obtain the Bernoulli effect of the gas supplied to the back side of the wafer, a large amount of gas is required as compared with the amount of gas used for the plasma treatment, which has a problem of affecting the plasma treatment under reduced pressure.

For example, in the processing of a wafer using plasma at a high degree of vacuum such as 1 Pa, gas is supplied at a flow rate of 300 SCCM for ionization or dissociation in the processing chamber. In the related art, there is a problem in which, when such pressure conditions are used, since the gas supplied for floating the wafer flows out from the outer circumferential edge of the wafer into the processing chamber, there is a problem that, if the supply amount of the gas for floating is large, a large-capacity exhaust device is required to maintain the pressure condition inside the processing chamber and the apparatus increases in size. Further, the gas flowing into the processing chamber from the outer circumferential edge of the wafer diffuses into the processing chamber, which affects the state of ionization or dissociation of the gas supplied for processing the processing target film layer on the upper side of the wafer, the processing result due to the plasma deviates from the expected result and the processing yield is impaired.

Furthermore, JP-A-2017-183700 discloses a technique in which a gas to be cooled for one wafer is switched for each process in a processing chamber so that the temperature of the wafer can be set to a temperature suitable for each process for each process, and a plurality of processes are sequentially performed. However, PTL3 does not describe removal of reactive organisms formed on the wafer surface in processing the wafer in the plasma, and no consideration has been given to making it possible to set the temperature of the wafer at a temperature suitable for each process, while repeating the process using the plasma and the removal of the reactive organisms generated on the wafer.

SUMMARY OF THE INVENTION

An object of the present invention is to provide a wafer processing method and a wafer processing apparatus in which the yield of a series of processes is improved, in the case of repeatedly removing the reactive organisms formed on the wafer surface in processing the wafer in the plasma, while preventing the generation of particles due to the contact between the sample placing surface of the sample stage and the wafer to be processed placed thereon.

The above object is achieved by a method of processing a wafer in which a process target wafer is placed on a sample stage disposed in a processing chamber inside a vacuum chamber, the method comprising: supplying an electric field from the high-frequency power supply into the vacuum chamber to form plasma using processing gas introduced into the vacuum chamber from a processing gas supply unit, while causing a refrigerant supplied from a refrigerant supply device to a refrigerant flow passage disposed inside the sample stage to circulate, holding the wafer on an electrostatic chuck disposed on an upper portion of the sample stage and including a central portion formed in a concave shape with respect to a peripheral portion thereof to attract the wafer by an electrostatic force, and while supplying a plurality of heat transfer gases having thermal conductivity from the heat transfer gas supply unit between the wafer and the central portion formed in the concave shape of the electrostatic chuck unit from a plurality of openings arranged on the top surface of the electrostatic chuck unit, processing the wafer according to a plurality of processes comprising a reaction step and a desorption step; and, in the plurality of processes, controlling the heat transfer gas supply unit to adjust the amount or pressure of at least one of the plurality of heat transfer gases introduced from the opening in a state in which the wafer is held above the electrostatic chuck unit in a non-contact manner to adjust the height of or a pressure in a gap between a top surface of the wafer and a top surface of the electrostatic chuck unit to a predetermined value of each of the plurality of processes, thereby processing the wafer, while controlling the temperature of the wafer in accordance with the plurality of processes for processing the wafer, in which each of said plurality of heat transfer gases has a respectively different heat transfer rate.

In addition, the above-described object is achieved by a method of processing a wafer in which a process target wafer is placed on a sample stage disposed in a processing chamber inside a vacuum chamber, an electric field is supplied from the high-frequency power supply into the vacuum chamber to form plasma using processing gas introduced into the vacuum chamber from a processing gas supply unit, while causing a refrigerant supplied from a refrigerant supply device to a refrigerant flow passage disposed inside the sample stage to circulate, the wafer is placed and held on an electrostatic chuck disposed on an upper portion of the sample stage and including a central portion formed in a concave shape with respect to a peripheral portion thereof to attract the wafer by an electrostatic force, and while supplying heat transfer gas having thermal conductivity from the heat transfer gas supply unit between the wafer and the central portion formed in the concave shape of the electrostatic chuck unit from the plurality of openings arranged on the top surface of the electrostatic chuck unit, the wafer is processed by a plurality of processes, wherein in the plurality of processes, the control unit controls the heat transfer gas supply unit to adjust the amount or pressure of the heat transfer gas introduced from the opening in a state in which the wafer is placed on the electrostatic chuck unit to adjust the height between a top surface of the wafer and a top surface of the electrostatic chuck unit to a predetermined value of each of the plurality of processes, thereby processing the wafer, while controlling the temperature of the wafer in accordance with the plurality of processes for processing the wafer.

According to the invention, it is possible to hold a sample on a sample stage in a reduced-pressure atmosphere in a non-contact manner, and to process the sample, without causing particles to change in the sample temperature in the processing chamber, and without affecting on processing under reduced pressure.

DESCRIPTION OF EMBODIMENTS

Hereinafter, examples of the present invention will be described with reference to the drawings.

First Example

An example of the invention will be described with reference to FIGS. 1 to 13.

Figure 1:
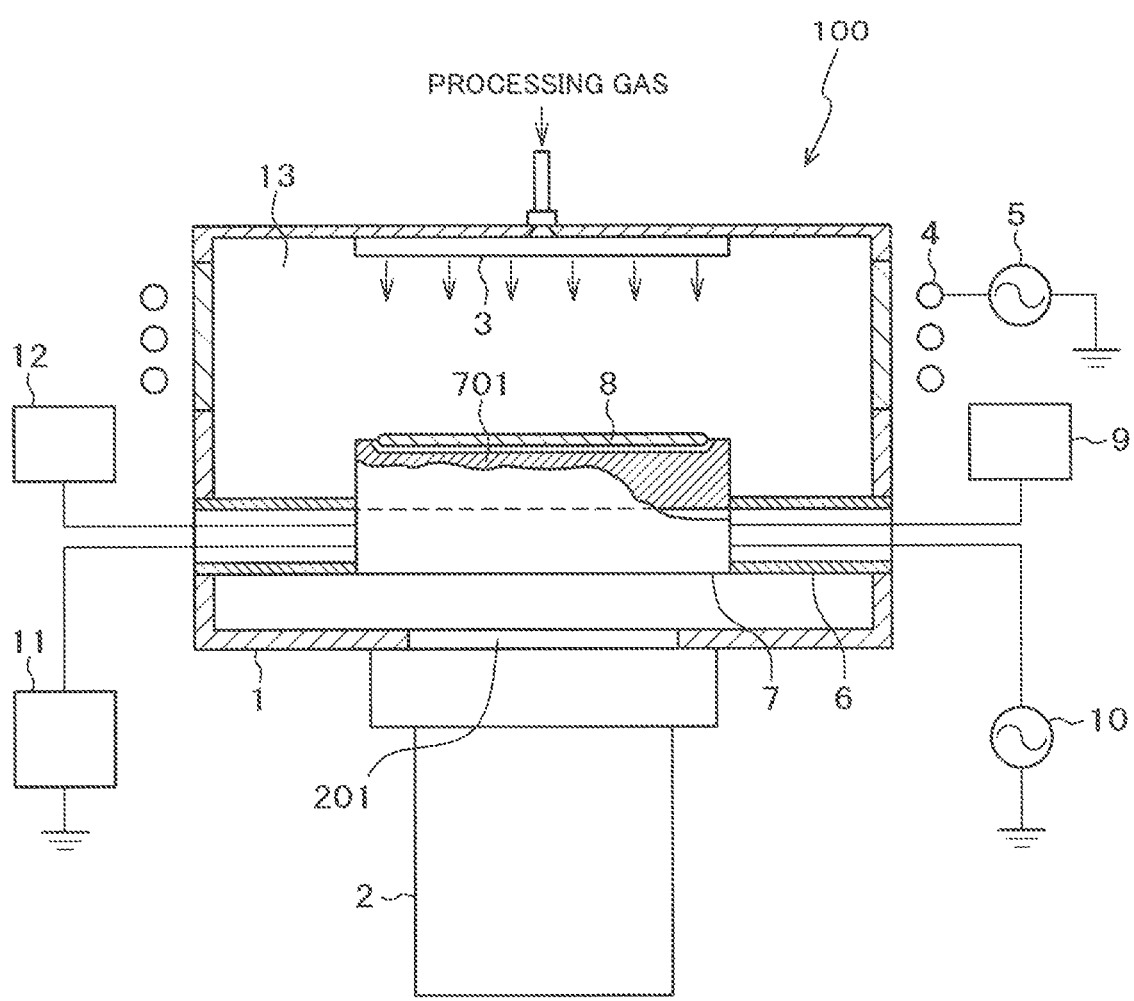
FIG. 1 is a vertical cross-sectional view schematically illustrating an outline of a configuration of a wafer processing apparatus according to an example of the present invention.

FIG. 1 is a vertical cross-sectional view schematically illustrating an outline of a configuration of a wafer processing apparatus 100 according to an example of the invention. The wafer processing apparatus 100 of this example is a plasma processing apparatus which supplies an induction coil 4 disposed outside the vacuum chamber 1 with high-frequency power from a high-frequency power supply 5, while supplying processing gas into a processing chamber 13 inside a vacuum chamber 1 in which pressure has been reduced, and excites the gas for processing by an inductive electric field formed inside the processing chamber 13 to process a film layer to be processed on the surface of the wafer by etching or the like, using plasma formed by inductive coupling.

Figure 2:
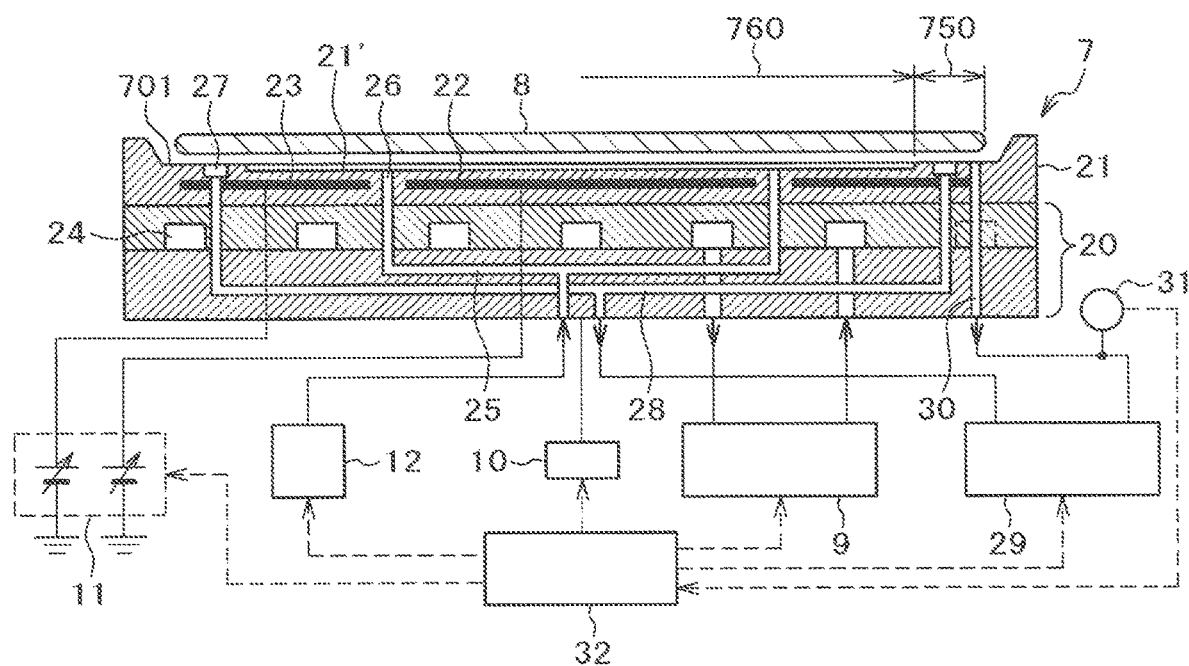
FIG. 2 is a vertical cross-sectional view schematically illustrating an enlarged schematic configuration of a portion of a wafer processing apparatus according to the example illustrated in FIG. 1 including a sample stage.
Figure 3:
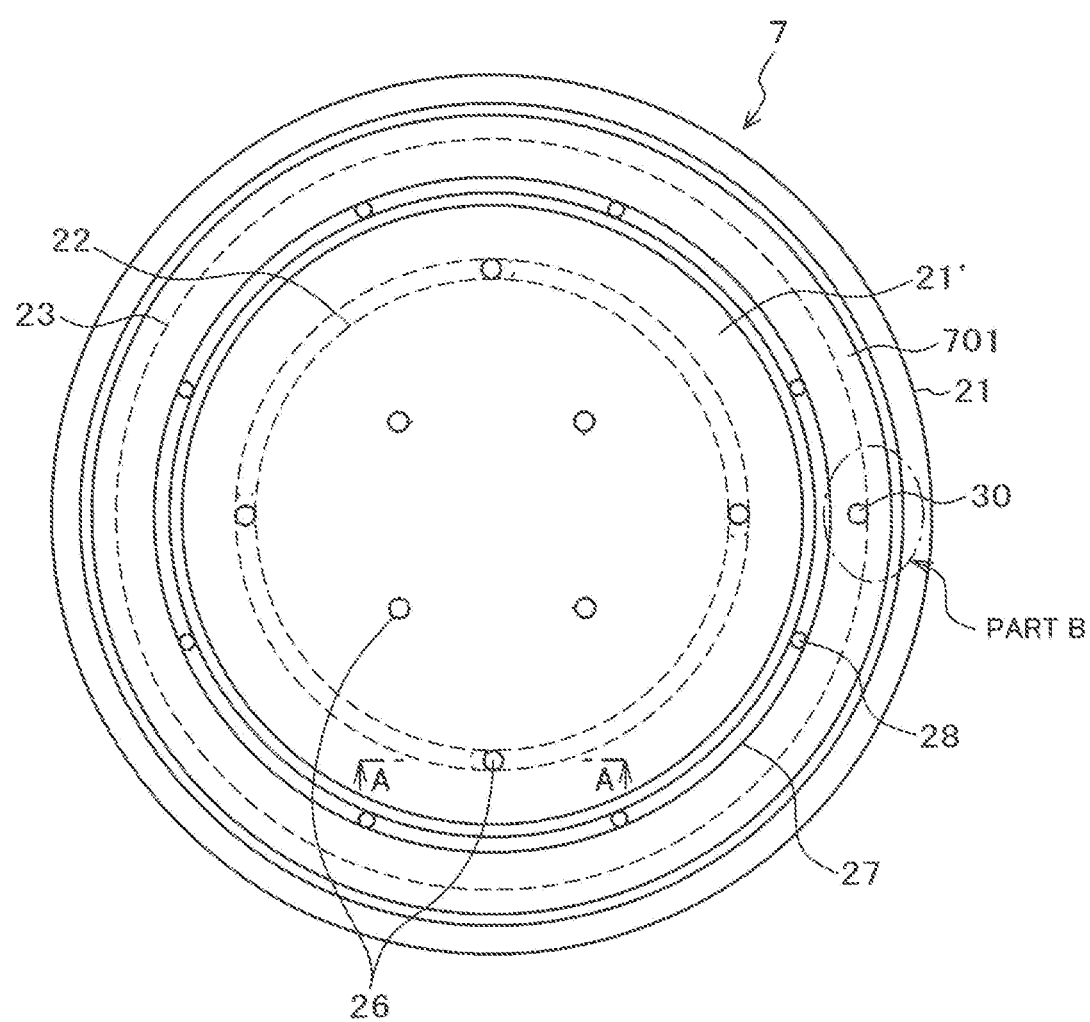
FIG. 3 is a plan view schematically illustrating the configuration of the upper side of the sample stage illustrated in FIG. 2.

FIG. 2 is an enlarged vertical cross-sectional view schematically illustrating an outline of a configuration of a portion including the sample stage 7 of the wafer processing apparatus 100 according to the example illustrated in FIG. 1. FIG. 3 is a plan view schematically illustrating the configuration of the top surface of the sample stage 7 illustrated in FIG. 2.

The vacuum chamber 1 is a container including a processing chamber 13 which is a space in which a substrate-like sample to be processed such as a semiconductor wafer is disposed, and is a space in which the sample in which the pressure is reduced, and is a metal container in which an inner surface of the processing chamber 13 is covered with a plasma resistant material. An opening 201 connected to the exhaust device 2 is disposed on the lower surface of the vacuum chamber 1, and particles such as gas are discharged from the processing chamber 13 inside the vacuum chamber 1 through the opening 201, and the space inside the processing chamber 13 is reduced to a predetermined degree of vacuum value. A ground electrode 3 is provided above the space of the processing chamber 13 inside the vacuum chamber 1 as a member constituting a ceiling surface of the processing chamber 13. The ground electrode 3 of this example also serves as a plate which has a disc shape, and includes plurality of through holes which are connected to the processing gas supply device (not shown) at the center and through which the processing gas flows toward the lower space.

At least a part of the side wall of the cylindrical part of the vacuum chamber 1 of this example is made of a dielectric material, and the outer circumferential side of the cylindrical dielectric portion is wrapped at least one stage or more in the vertical direction with the induction coil 4 at a distance. The induction coil 4 is electrically connected to a high-frequency power supply 5 for plasma generation via a matching unit (not illustrated), and high-frequency power of a predetermined frequency, for example, 27.12 MHz, is supplied from the high-frequency power supply 5.

A sample stage 7 is arranged at the center portion in the height direction of the space inside the vacuum chamber 1, and is connected to the vacuum chamber 1 and is supported at a position of a predetermined height via at least three arms 6 radially arranged around the central axis of the sample stage 7 in the vertical direction at an interval of an angle that is considered to be the same or the same as each other as seen from the above at the circumference of its outer circumference. A circle of the sample stage 7 having a cylindrical shape or a circular top surface approximate to this can form a placing surface on which the wafer 8 can be placed. In this example, the center of the processing chamber 13 in which at least a part above the sample stage 7 of the vacuum chamber 1 has a cylindrical portion, the opening 201 having the circular shape, the ground electrode 3 and the placing surface 701 of the sample stage 7 is arranged at a position approximate to the extent that it matches or can be regarded as seen from above, and the center axes of these constituent elements having a disc or a cylindrical shape are aligned and arranged.

The sample stage 7 illustrated in FIG. 2 is provided with a circular electrode plate 20 including a refrigerant flow passage 24 formed therein or a metal electrode block 20 having a cylindrical shape and an electrostatic chuck 21 disposed on the electrode block 20. The electrode block 20 is connected to the high-frequency power supply 10 for supplying bias forming power via a matching unit (not illustrated), and high-frequency power of a predetermined frequency, for example, 400 KHz, is supplied from the high-frequency power supply 10. The electrode block 20 is arranged in multiple circular arcs or spirals, and has a refrigerant flow passage 24 in which a plurality of circular arcs or a refrigerant flow passage 24 arranged in a spiral shape and through which the refrigerant flows inside is disposed inside. By repeating the circulation in which the refrigerant supplied to the refrigerant supply device 9 connected to the inlet and outlet of the refrigerant flow passage 24 is supplied with the refrigerant controlled at a predetermined temperature and is returned to the refrigerant supply device 9, the electrode block 20 heat-exchanged with the refrigerant and the sample block 7 is adjusted to a temperature within a predetermined range.

The electrostatic chuck 21 of this example is formed by firing a ceramic material such as alumina, yttrium or the like into a shape having a disk shape, and a metallic film-like inner electrode 22 for dipole type electrostatic adsorption and a ring-shaped outer electrode 23 surrounding the inner electrode are disposed therein. Further, the inner electrode 22 and the outer electrode 23 are electrically connected to different DC power supplies 11 respectively, and in a state in which the wafer 8 is placed on the top surface of the electrostatic chuck 21 (the placing surface 701 of the sample stage 7), different polarities are imparted, and attractive force due to static electricity between the wafer 8 and the charges is generated.

On the upper side of the electrostatic chuck 21, a placing surface 701 having a shape substantially equivalent to the planar shape of the wafer 8 is provided. A heat transfer gas supply passage 25 including an opening of the outlet on the placing surface 701 on the top surface of the electrostatic chuck 21, and a heat transfer gas supply passage 25 at the inlet of the ring groove 27 disposed at the outer circumference side of the placing surface 701 are disposed inside the sample stage 7. The inlet of the heat transfer gas supply passage 25 is connected to the heat transfer gas supply device 12 via a pipe line, and the inlet of the heat transfer gas discharge path 28 is connected to the gas discharge device 29 via a pipe line.

A planar shape of the placing surface 701 of the wafer 8 on the upper side of the electrostatic chuck 21 as viewed from above has the same shape as the back side of the wafer 8 placed thereon, and in the state in which the wafer 8 is placed, a space sandwiched between the back side and the placing surface 701 is configured as a space for dispersing the heat transfer gas. Further, in this example, the recessed portion 21' having a depth of about several tens of microns from the upper side of the outer circumferential portion is disposed on the placing surface 701. The heat transfer gas supplied between the wafer 8 and the placing surface 701 is diffused into a heat transfer gas dispersion region which is a space between the concave portion 21' surrounded by the raised outer circumferential side (placing surface 701) and the back side of the wafer 8, and the pressure is set to a value within a predetermined range.

Figure 4:
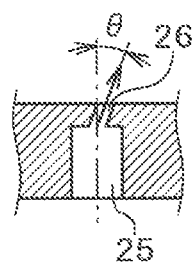
FIG. 4 is a vertical cross-sectional view schematically illustrating an enlarged schematic cross-sectional view of a gas supply hole of the sample stage illustrated in FIG. 3, taken along a line A-A.
Figure 5:
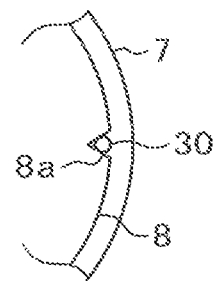
FIG. 5 is an enlarged plan view illustrating a part B including a detection hole provided with a detector for detecting the pressure of gas on the upper side of the sample stage illustrated in FIG. 3.

As illustrated in FIG. 3, a plurality of supply holes 26, which are openings of the outlet of the heat transfer gas supply passage 25, are arranged in the region of the recessed portion 21'. The configuration of the supply hole 26 of this example is illustrated in FIG. 4. FIG. 4 is a vertical cross-sectional view schematically illustrating the configuration of the supply hole 26 for supplying the gas of the sample stage 7 illustrated in FIG. 3 in an enlarged manner in a cross section taken along the arrow line A-A. FIG. 5 is an enlarged plan view illustrating a part B including a detection hole 30 provided with a pressure sensor 31 which is a detector for detecting the pressure of gas on the upper side of the sample stage 7 illustrated in FIG. 3.

As illustrated in FIG. 4, the supply hole 26 of this example is provided at the tip end of the heat transfer gas supply passage 25 so as to have an inclination θ direction in the counterclockwise direction along the recessed portion 21' or the placing surface or the circumferential direction of the electrostatic chuck 21 with respect to the center. In addition, the supply hole 26 of this example is disposed at positions that are equal or substantially equal to each other around the center at a plurality of locations (four in the present example) in the ring-shaped region between the inner electrode 22 and the outer electrode 23 each having a circular shape and a ring shape surrounding the circular shape when viewed from above, and the locations (four in the present example) on the circumference separated by a predetermined radial distance from the center in the region above the inner electrode 22.

Further, on the outer circumferential side of the recessed portion 21' of the wafer placing surface of the electrostatic chuck 21, the placing surface 701 surrounding the recessed portion 21' in a ring shape and including a bottom surface of the recessed portion 21' and a size of several tens of microns with its top surface raised functions as a heat transfer gas seal region 750, and faces the outer circumferential side portion including the outer circumferential end of the back side of the wafer 8 in a state in which the wafer 8 is placed thereon. The heat transfer gas seal region 750, as illustrated in FIG. 3, a ring groove 27 in which a plurality of inlet openings of the heat transfer gas discharge passage 28 is a portion arranged in a ring shape when the top surface of the electrostatic chuck 21 is viewed from above, and the outer circumferential end is larger than the diameter of the wafer 8 from the outer circumferential end of the recessed portion 21'.

In a state in which the wafer 8 is placed above the electrostatic chuck 21 and held above the recess 21' in a non-contact manner, a distance smaller than the distance between the bottom surface of the recessed portion 21' and the back side of the wafer 8 is maintained, and the heat transfer gas seal region and the back side of the wafer 8 are also in non-contact with each other. Further, in the heat transfer gas seal region 750, there is a gap smaller than the region (heat transfer gas dispersion region 760: corresponding to the diameter of the recessed portion 21'), and the heat transfer gas having flowed into the heat transfer gas seal region 750 from the recessed portion 21' is discharged from the heat transfer gas discharge passage 28 via the gas discharge device 29 through the opening of the heat transfer gas discharge passage 28 disposed inside the ring groove 27. With this configuration, resistance of the heat transfer gas flow in the heat transfer gas seal region 750 is increased, and the amount of the heat transfer gas flowing out from the outer circumferential side of the electrostatic chuck 21 to the processing chamber 13 in the vacuum chamber 1 through the region is made small.

As illustrated in FIG. 5, the detection hole 30 is formed such that the position of the opening on the upper side of the placing surface overlaps the position of the notch 8a provided in advance on the wafer 8 in a state in which the wafer 8 is placed. The outlet of the detection hole 30 below the sample stage 7 is connected to the gas discharge device 29 via a pipe constituting the pipe path, and the pressure sensor 31 is attached to the middle of the pipe. The gas discharge device 29 including an exhaust pump such as a rotary pump for rough drawing is constantly driven irrespective of the process of processing the wafer 8 and the inside of the detection hole 30 is constantly exhausted to the outside of the vacuum chamber 1 through piping. When the notch 8a of the wafer 8 is located right above the detection hole 30, the wafer 8 directly communicates with the processing chamber 13 which is the space inside the vacuum chamber 1, which is the space on the upper side of the wafer 8.

The refrigerant supply device 9, the DC power supply 11, the heat transfer gas supply device 12, the gas discharge device 29, and a pressure sensor 31 connected to a pipe connecting between the detection hole 30 and the gas discharge device 29 to detect the internal pressure are communicatively connected to a control device 32 including an arithmetic unit with a semiconductor device, a storage device such as a RAM or a ROM, and an interface for relaying communication between them and the outside. For example, a signal output as a result of detection by the pressure sensor 31 is transmitted and received by the control device 32 via a communication path of wired or wireless, and software prestored in a storage device inside the control device 32 is read, and the computing unit computes the command in accordance with the algorithm. Further, a signal corresponding to the command is output from the control device 32 via the interface, is received at the relevant part through a communication path as a signal instructing the operation to the part to be controlled constituting the wafer processing apparatus 100 of the present embodiment such as the refrigerant supply device 9, the DC power supply 11, the heat transfer gas supply device 12 and the gas discharge device 29, and an operation based on the command signal is performed.

Figure 6:
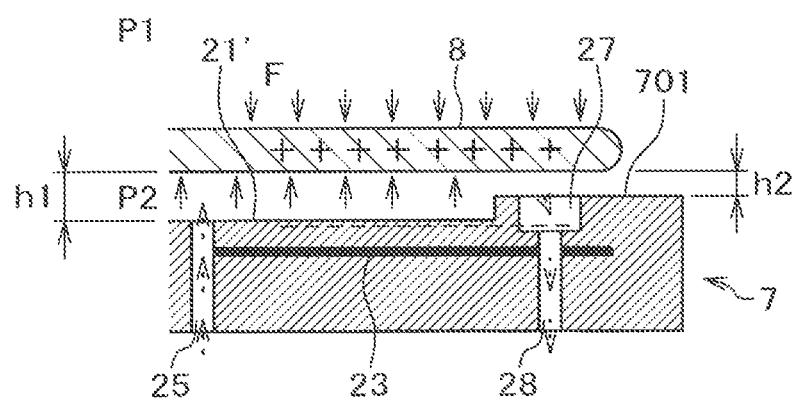
FIG. 6 is a vertical cross-sectional view schematically illustrating an arrangement of a wafer placed on a sample stage illustrated in FIG. 2 and held in a non-contact manner and a sample stage.

Next, the operation of the wafer processing apparatus 100 of this example will be described with reference to FIGS. 6 to 14. FIG. 6 is a vertical cross-sectional view schematically illustrating the arrangement of the wafer 8 and the sample stage 7 placed on the sample stage 7 illustrated in FIG. 2 and held in a non-contact manner.

Figure 7A:
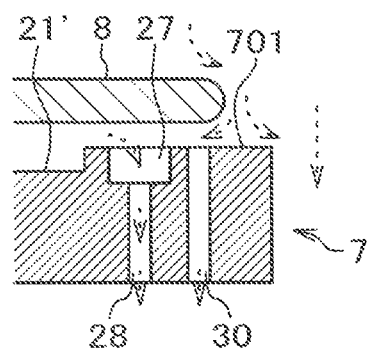
FIGS. 7A to 7C are enlarged vertical cross-sectional views schematically illustrating a configuration of an outer circumferential end portion of the sample stage illustrated in FIG. 6.
Figure 7B:
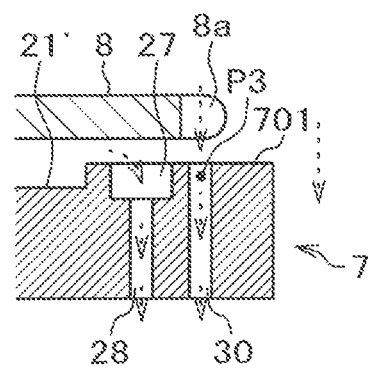
Figure 7C:
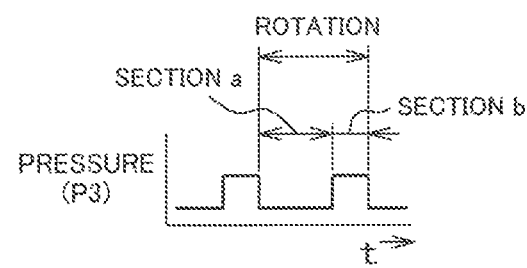
Figure 8:
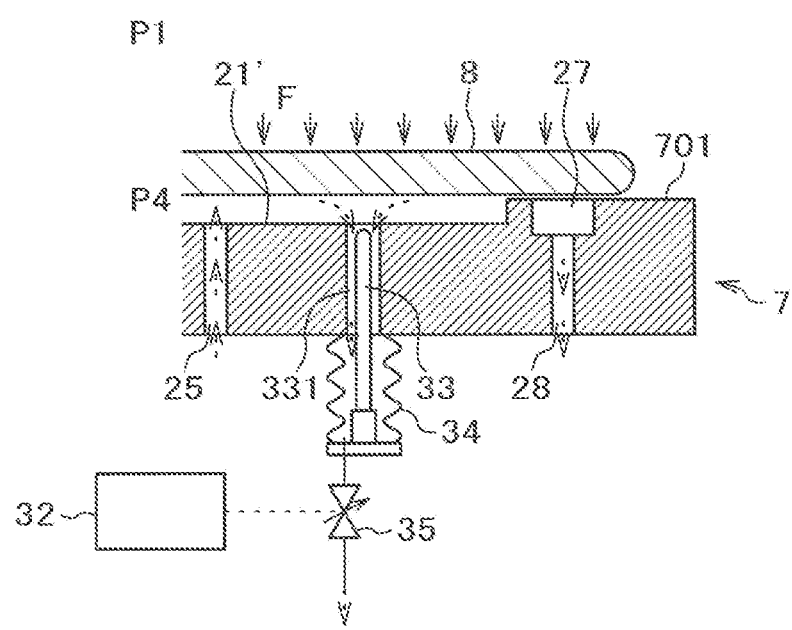
FIG. 8 is a vertical cross-sectional view schematically illustrating the arrangement of a wafer and a sample stage in a state of being placed on the sample stage illustrated in FIG. 2 and in contact with the upper side thereof.

FIGS. 7A to 7C are enlarged vertical cross-sectional views schematically illustrating the configuration of the outer circumferential end portion of the sample stage illustrated in FIG. 6. FIG. 8 is a vertical cross-sectional view schematically illustrating the arrangement of the wafer and the sample stage placed on the sample stage illustrated in FIG. 2 and in contact with the upper side thereof.

The outside wall of the vacuum chamber 1 of the wafer processing apparatus 100 of this example is connected to another vacuum chamber (not illustrated) which is a vacuum chamber in which the wafer 8 to be processed is conveyed by a conveying device (not illustrated), such as a robot arm, which is depressurized to a pressure equivalent to that of the processing chamber inside the vacuum chamber 1. Prior to the processing of the wafer 8 in the processing chamber 13 inside the vacuum chamber 1, the wafer 8 as a sample is carried into the processing chamber 13 by a transfer device (not illustrated) and placed on the sample stage 7.

In the wafer 8 placed on the sample stage 7, electrostatic charges are generated between the inner electrode 22 and the wafer 8 and between the outer electrode 23 and the wafer 8 by voltages having specific sizes and polarities supplied from the DC power supply 11 due to electrostatic forces and electrostatic forces between these positive and negative charges, and the wafer 8 is attracted to the electrostatic chuck 21 and the vicinity of the outer periphery of the wafer 8 is held on the sample stage 7 in a state of being in contact with the placing surface 701. Thereafter, the processing chamber 13 into which the wafer 8 has been loaded is hermetically sealed by a gate valve (not illustrated), which is an opening for wafer transfer, disposed on the side wall surface of the vacuum chamber 1 by a gate valve, and the pressure is reduced to a predetermined pressure by driving the exhaust device 2.

After the wafer 8 is electrostatically attracted to the sample stage 7, the heat transfer gas is supplied from the heat transfer gas supply device 12 to the gap between the back side of the wafer 8 and the recessed portion 21' formed on the top surface of the electrostatic chuck 21 via the heat transfer gas supply passage 25 and the supply hole 26. The heat transfer gas seal region 750 of the placing surface 701 formed on the upper side of the electrostatic chuck 21 in a state of electrostatic attraction and the outer circumferential side portion of the back side of the wafer 8 are brought into close contact with each other. This prevents the heat transfer gas from leaking (leaking) from the region into the processing chamber on the outer periphery of the electrostatic chuck 21.

The heat transfer gas supplied between the wafer 8 and the electrostatic chuck 21 is dispersed and filled in the heat transfer gas dispersion region 760 sandwiched between the recessed portion 21' and the wafer 8, and by setting the pressure of the heat transfer gas in the region to be equal to or higher than the predetermined value, the heat transfer between the wafer 8 and the sample stage 7 and the electrostatic chuck 21 is improved. Thus, the temperature of the wafer 8 is adjusted to a temperature at which the refrigerant adjusted by the refrigerant supply device 9 is brought close to the temperature of the electrode block 20 or the sample stage 7 supplied to the internal refrigerant passage 24.

Even though O minute irregularities within the common sense range of technology exist on the surfaces of the wafer 8 and the sample stage 7, and in the heat transfer gas seal region 750, the wafer 8 and the placing surface 701 of the sample stage 7 are brought into contact with each other and in close contact therewith, there is a minute gap due to the unevenness between them, and leakage of the heat transfer gas occurs slightly.

Next, in the processing chamber 13, a gas for processing the wafer 8, in this example, an etching gas is supplied from a ground electrode 3 also serving as a shower plate by a gas supply means (not shown), and by the balance between the depressurization by the operation of the exhaust device 2 and the supply amount of the processing gas, the inside of the processing chamber 13 is held at the pressure within the predetermined range. When it is detected by the pressure detection means not illustrated that the pressure falls within a range suited to the processing conditions, in response to the command signal from the control device 32, the high-frequency power is supplied from the high-frequency power supply 5 to the induction coil 4, and atoms or molecules of the etching gas are dissociated and excited by an induced current generated in the processing chamber 13 by the induced magnetic field formed in the processing chamber 13 by the high-frequency power, and plasma is generated in the processing chamber 13.

In this example, as illustrated in FIG. 6, by the supply of the heat transfer gas from the heat transfer gas supply device 12, by setting the force of pushing upward the wafer 8 caused by the pressure of the heat transfer gas on the back side of the wafer 8 (the upward arrow in FIG. 6) to be greater than a force (d downward arrow in FIG. 6) trying to draw downward due to the electrostatic force generated on the wafer 8, the wafer 8 is caused to float from the placing surface 701 of the electrostatic chuck 21 to hold the wafer 8 in a non-contact manner.

That is, from a state in which the wafer 8 is in contact with the placing surface 701 of the electrostatic chuck 21, the heat transfer gas supply device 12 increases the amount of gas and increasing the pressure P2 of the heat transfer gas in the heat transfer gas dispersion region 760 to be supplied to the transfer gas supply passage 25 in accordance with a command signal from the control device 32, so that in the region, the sum total of forces due to the pressure P2 of the heat transfer gas of the wafer 8 is applied to the inner electrode 22 becomes greater than the attractive force F due to static electricity between the outer electrode 23 and the wafer 8 and the force in which the pressure P1 of the gas in the processing chamber is transferred to the wafer 8, and the wafer 8 floats away from the placing surface 701 of the electrostatic chuck 21. Thereafter, since the heat transfer gas leaks from the heat transfer gas dispersion region 760 into the processing chamber 13 via the heat transfer gas seal region 750, the upward force due to the pressure of the heat transfer gas to the back surface of the wafer 8 decreases, as a result of balancing the electrostatic force and the sum of the pressures of the gases in the processing chamber 13, the wafer 8 is in a non-contact manner above the electrostatic chuck 21, the operation of the heat transfer gas supply device 12 or the gas discharge device 29 according to the command signal from the control device 32 is adjusted, and a predetermined distance (height) h1 or h2 between the wafer 8 and the heat transfer gas dispersion region 760 of the electrostatic chuck 21 and the top surface of the heat transfer gas seal region 750 is maintained.

Since the gap h2 is generated between the wafer 8 and the upper side of the electrostatic chuck 21 in the heat transfer gas seal region 750, the amount of leakage of the heat transfer gas from the heat transfer gas dispersion region 760 to the outer circumferential side of the wafer 8 increases, and the pressure of the gas in the gas dispersion region 760 decreases. However, the conductance of the gas flow in the heat transfer gas seal region 750 is made sufficiently small, and the wafer in the heat transfer gas dispersion region 760 and the heat transfer gas seal region 750 8 has a size large enough to maintain the wafer 8 in a non-contact manner. Further, the heat transfer gas flowing in the heat transfer gas seal region 750 flows through the inlet of the plurality of heat transfer gas discharge passages 28 arranged on the bottom surface of the ring groove 27 disposed on the upper side of the electrostatic chuck 21 of the heat transfer gas seal region 750, and is discharged from the upper side of the sample stage 7. This prevents influence on the processing gas in the processing chamber due to flowing out of the heat transfer gas from the outer circumferential portion of the wafer 8 into the processing chamber 13 or the distribution of the plasma formed by dissociation and ionization of the processing gas.

As described above, in the heat transfer gas seal region 750 of the sample stage 7, in a state in which the wafer 8 is placed on the placing surface 701 for the wafer 8 of the electrostatic chuck 21 at a position approximate to the point where the center of the wafer 8 matches or is regarded as this, a detection hole 30 in which the range of the opening is located so as to overlap with the area to be projected of the notch 8a when viewed from above is disposed. FIGS. 7A to 7C schematically illustrate the corresponding a positional relation between the detection hole 30 and the notch 8a of the wafer 8.

As illustrated in FIG. 7A, in this example, when the notch 8a is not located right above the detection hole 30, the opening of the detection hole 30 is covered by the outer circumferential end portion of the wafer 8, in other words, it became an occupied state, the gas for processing or the particles of plasma in the processing chamber 13 is prevented from substantially flowing into the detection hole 30, and passes through the space at the outer circumferential portion of the sample stage 7 and is exhausted to the outside through the exhaust opening portion 201 at the bottom portion of the vacuum chamber 1. In this example, in this state, the amount of etching gas flowing through the gap h2 of the heat transfer gas seal region 750 and flowing into the detection hole 30 is negligible.

In contrast, as illustrated in FIG. 7B, in a state in which the notch 8a formed on the wafer 8 is positioned directly above the detection hole 30, the detection hole 30 overlaps the projection plane of the notch 8a as viewed from above to be connected to the processing chamber 13, and a part of the etching gas or particles of the plasma enters the detection hole 30 and is discharged through the gas discharge device 29. When the notch 8a is intermittently positioned above and overlaps the detection hole 30, in the gas pressure P3 in the detection hole 30 detected by the pressure sensor 31 is schematically illustrated in FIG. 7C, the pressure is low in the section a in which the notch 8a is not positioned above the detection hole 30, and the pressure is high in the section b in which the notch 8a is located above the detection hole 30.

From this, it can be seen that it is possible to detect that the notch 8a is positioned directly above the detection hole 30 by measuring the gas pressure of the detection hole 30 with the pressure sensor 31. In this example, whether the notch 8a of the wafer 8 is positioned above the detection hole 30 is detected in the control device 32 which receives the output of the pressure sensor 31.

In the heat transfer gas dispersion region 760 of the sample stage 7, a plurality of through holes 331 are provided for causing the lift pins 33 used when placing the wafer 8 on the sample stage 7 or separating it from the sample stage 7 illustrated in FIG. 8 to protrude above the electrostatic chuck 21 or accommodating them inside the sample stage 7. Further, under the sample stage 7, below the opening in the lower part of the plurality of through holes 331 which are accommodated in the lift pins 33 in the inside and penetrate the sample stage 7 in the vertical direction, a bellows 34 which surrounds the periphery of each lift pin 33 and expands and contracts in accordance with the vertical movement of the lift pin 33 is provided, and air-tightly seals between the space inside the through hole 331 and the space around the lift pin 33 and the external atmosphere.

A gas discharge device 29 is connected to the bottom of the space in the bellows 34 in which the lift pins 33 inside the sample stage 7 are accommodated and communicated with the through holes 331 via an exhaust pipe line in which the flow control valve 35 is disposed, and the space inside the bellows 34 communicates with the inside. As a result, the heat transfer gas in the heat transfer gas dispersion region 760 can be discharged through the upper opening disposed in the recessed portion 21' on the upper side of the electrostatic chuck 21 and the through hole 331 communicating therewith. The discharge amount of the heat transfer gas from the space inside the bellows 34 is adjusted by increasing or decreasing the opening degree of the flow control valve 35 driven in accordance with the command signal from the control device 32. In this example, in a state in which the amount of the heat transfer gas supplied from the heat transfer gas supply passage 25 is constant, the amount or speed of heat transfer gas discharge from the inside of the bellows 34 is adjusted through the through hole 331 accommodating the lift pin 33, and thus, the pressure of the heat transfer gas to the back side of the wafer 8 in the heat transfer gas dispersion region 760 is adjusted, the gap h2 is maintained in a non-contact manner, and the amount of heat transfer between the wafer 8 and the electrostatic chuck 21 or the sample stage 7 is adjusted.

Figure 9:
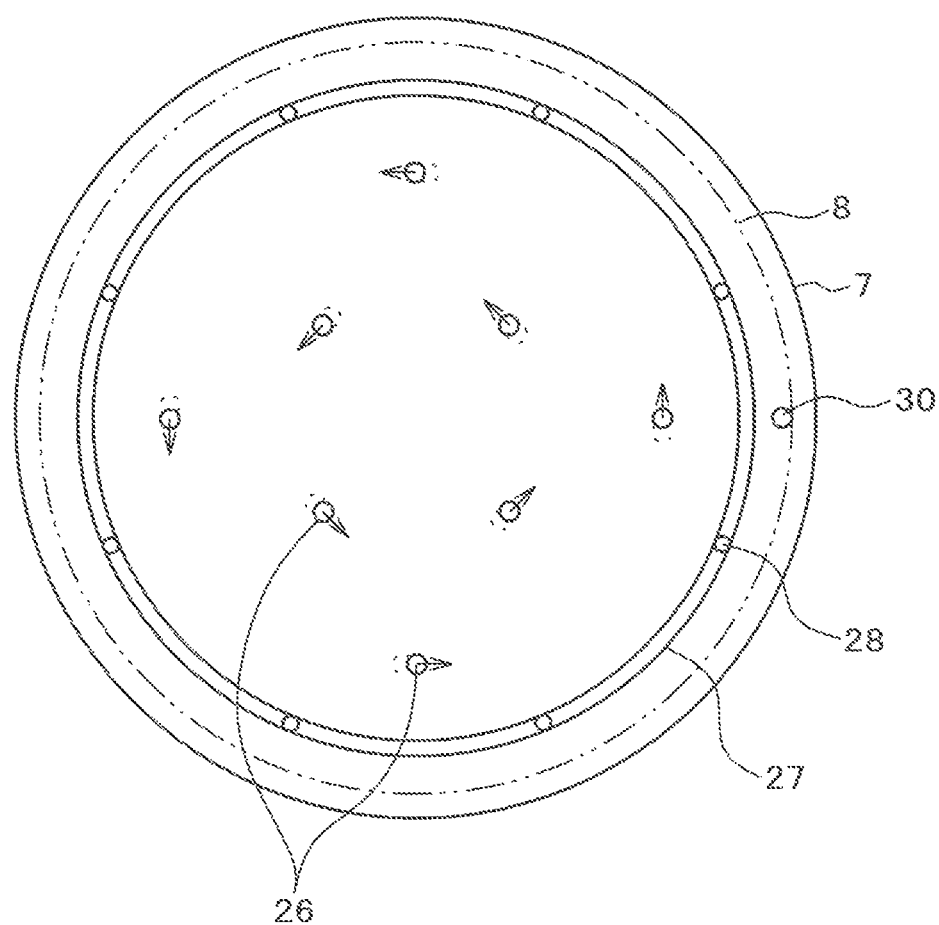
FIG. 9 is a top view schematically illustrating an outline of the configuration of the sample stage illustrated in FIG. 2 and the wafer of the state of being placed on the sample stage and held in a non-contact manner.
Figure 10:
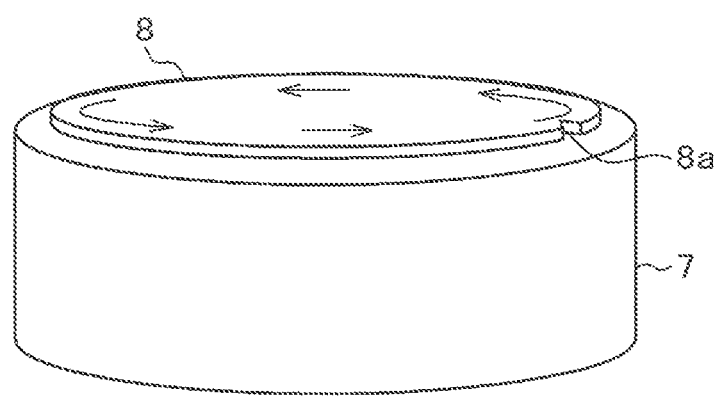
FIG. 10 is a perspective view schematically illustrating the outline of the configuration of the sample stage illustrated in FIG. 9 and the wafer of the state of being placed on the sample stage and held in a non-contact manner.
Figure 11A:
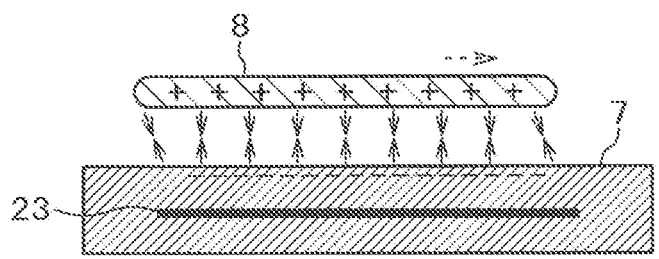
FIGS. 11A and 11B are vertical cross-sectional views schematically illustrating charges generated on the sample stage and the wafer illustrated in FIGS. 9 and 10 and its action.
Figure 11B:
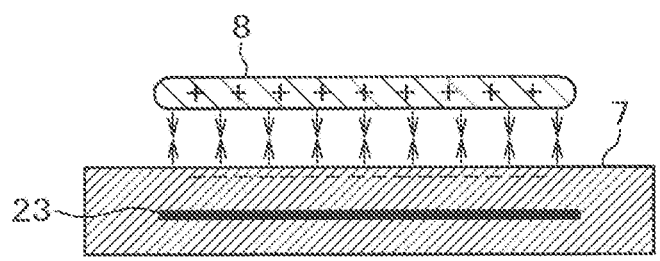

FIG. 9 is a top view schematically illustrating the outline of the configuration of the sample stage illustrated in FIG. 2 and the wafer placed on the sample stage and held in a non-contact manner. FIG. 10 is a perspective view schematically illustrating the outline of the configuration of the sample stage illustrated in FIG. 9 and the wafer placed on the sample stage and held in a non-contact manner. FIGS. 11A and 11B are vertical cross-sectional views schematically illustrating the charges generated on the sample stage and the wafer illustrated in FIGS. 9 and 10 and the action thereof.

Each of the supply holes 26 of the heat transfer gas of this example has a circular opening on the upper side of the heat transfer gas dispersion region 760 of the electrostatic chuck 21, and is disposed such that the direction of the central axis of the cylindrical hole communicating therewith below the opening is tilted by a predetermined angle θ from a line perpendicular to the top surface or the horizontal surface of the electrostatic chuck 21 counterclockwise around the circumferential direction when viewed from above. As illustrated in FIG. 9, the heat transfer gas supplied from the opening of the supply hole 26 is introduced upward and in a counterclockwise direction viewed from above in a direction inclined by an angle θ from a vertical line.

As illustrated in FIG. 10, the wafer 8, which is held at a predetermined distance from the placing surface 701 on the upper side of the electrostatic chuck 21 above the flow of the introduced heat transfer gas and kept out of contact therewith, is divided into a heat transfer gas dispersion region 760 along the flowing direction of the heat transfer gas. When the center of the wafer 8 does not fluctuate or is within a sufficiently small size during this rotation, the notch 8a passes directly above the detection hole 30 with the frequency of the rotation number with the rotation as described above, and the gas pressure in the detection hole 30 repeats increase and decrease at the same time interval (cycle) as the rotation number. In this example, the pressure sensor 31 is used to detect an increase or decrease in the periodic pressure, or a period thereof, and by using the information, the rotation speed of the wafer 8 is detected by the control device 32.

In order to adjust the rotational speed of the wafer 8 to a value within a desired range while maintaining the height h2 of the gap above the heat transfer gas seal area 750 to be constant or within a range allowed to vary, the flow rate or the speed of the heat transfer gas discharged from the heat transfer gas dispersion region 760 is adjusted by increasing or decreasing the opening degree of the flow rate control valve 35, while increasing or decreasing the flow rate or the speed of the heat transfer gas in the path 25. For example, by increasing the amount of the heat transfer gas to be supplied and increasing the amount to be discharged, it is possible to increase the rotation speed of the wafer 8, while preventing the variation of the height of the gap h2. Conversely, in the case of lowering the rotation speed, this is achieved by reducing the supply and discharge of heat transfer gas. Adjustment of the amount of supply and discharge as described above is achieved by driving the heat transfer gas supply device 12, the gas discharge device 29 or the flow rate control valve 35, on the basis of a command signal from the control device 32 which receives the detection signal of the pressure sensor 31.

In this example, the outer diameter of the outer electrode 23 is set to a size approximate to the extent that it can be regarded as the same as or equal to the diameter of the wafer 8, and a force in the horizontal direction acts on the wafer 8 held non-contact above the electrostatic chuck 21, in the direction of restoring the position when the position is shifted in the horizontal direction (horizontal direction in the drawings). FIGS. 11A and 11B schematically illustrate the force acting on the wafer 8 held above the sample stage 7 in this example in a non-contact manner from the sample stage 7.

As illustrated in FIG. 11A, when the wafer 8 is displaced to the left in the drawing, suction due to static electricity having a component in the horizontal direction (horizontal direction in the drawing) is formed on the outer circumferential end portion of the wafer 8 and the outer electrode 23, and the force of the component in the horizontal direction acts in a direction (horizontal direction in the drawing) in which the wafer 8 is returned to the original position to move the wafer 8 in the rightward direction. As the deviation of the wafer 8 becomes smaller, the force of the horizontal component also becomes smaller, eventually becoming a suction force in the vertical direction with respect to the adsorption surface as illustrated in FIG. 11B, the force of the horizontal component becomes zero, and is aligned to the central position. If the difference in size between the diameter of the wafer 8 and the diameter of the outer electrode 23 for electrostatic adsorption is within a predetermined allowable range, the horizontal components of the left and right attractive forces are balanced and a force tending to return the wafer 8 to the central portion of the outer electrode 23 which is the original position acts.

Figure 12:
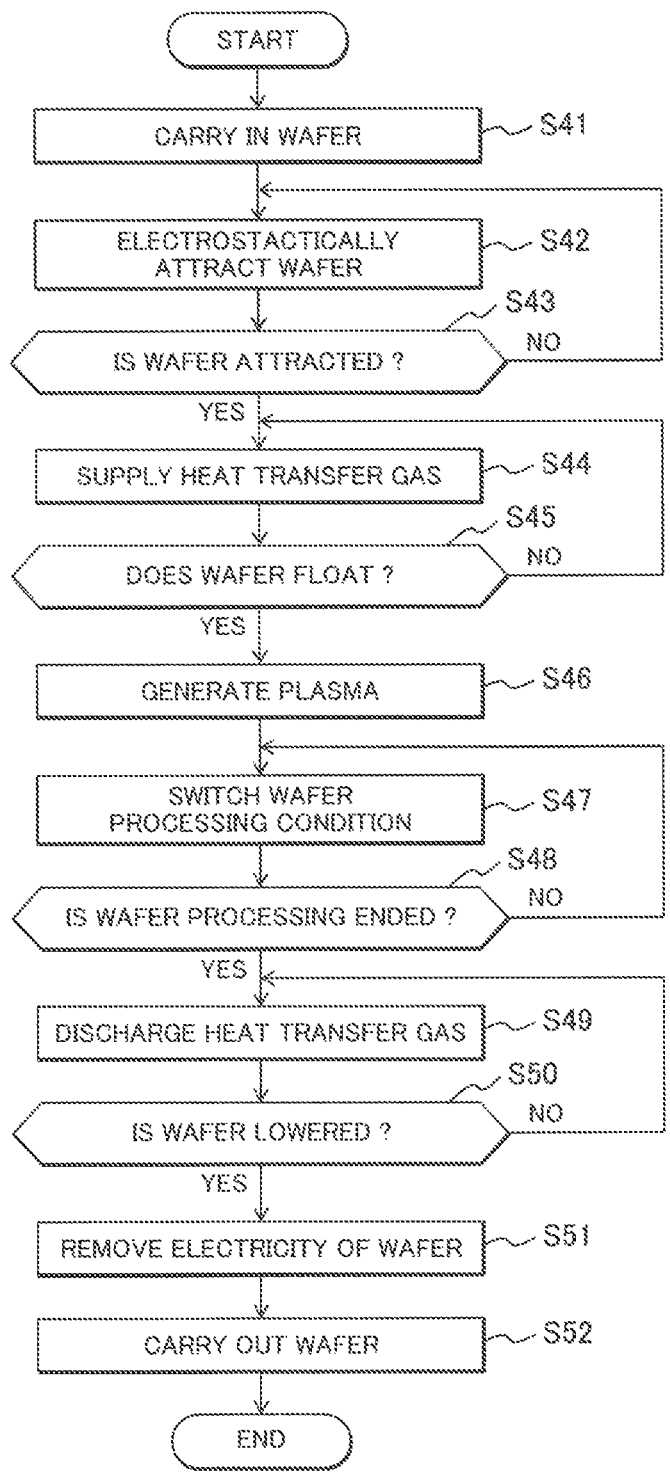
FIG. 12 is a flowchart schematically illustrating a flow of an operation of processing a wafer by the wafer processing apparatus according to the example illustrated in FIG. 1.
Figure 13:
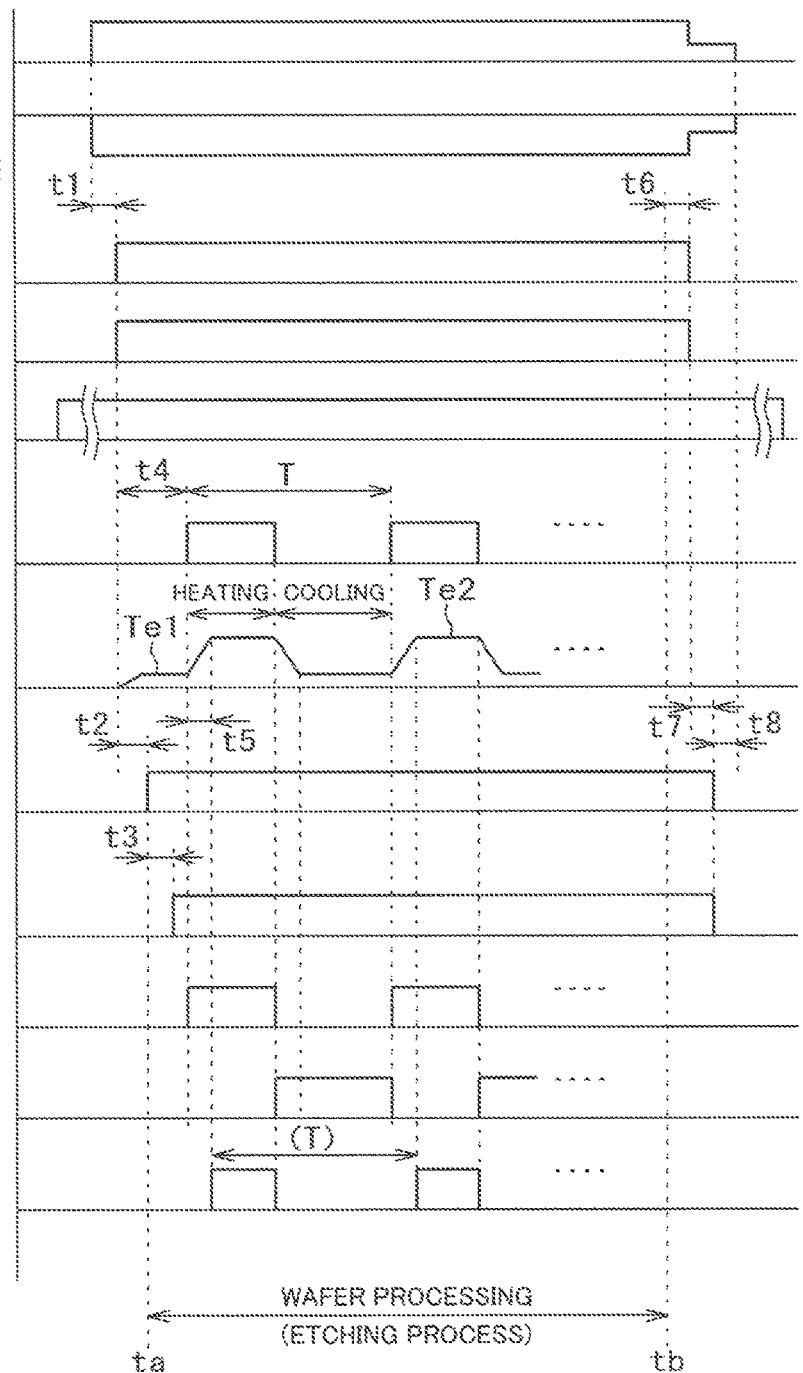
FIG. 13 is a time chart illustrating the operation of each part with the lapse of time when the wafer processing apparatus according to the example illustrated in FIG. 1 operates in accordance with the flowchart illustrated in FIG. 12.

An example of processing of the wafer 8 performed by the wafer processing apparatus 100 according to this example will be described with reference to FIGS. 12 and 13. FIG. 12 is a flowchart illustrating an outline of the flow of the operation of the wafer processing apparatus 100 according to the example illustrated in FIG. 1 for processing the wafer 8. FIG. 13 is a time chart illustrating the operation of each part with the lapse of time when the wafer processing apparatus 100 according to the example illustrated in FIG. 1 operates in accordance with the flowchart illustrated in FIG. 12.

As described above, the wafer 8 is placed on a transfer device such as a robot arm disposed in a transfer chamber inside a vacuum transfer container (not illustrated), and the arm extends and carried into the processing chamber, is placed on the upper end of a plurality of (three in this example) lift pins 33, and thereafter, the wafer 8 is moved downwardly until the lift pins 33 are accommodated in the through holes of the sample stage 7, and thus, the wafer 8 is placed on the top surface of the electrostatic chuck 21 (step S41). Prior to this, the supply of the refrigerant at a predetermined temperature is started to be circulated in the refrigerant flow passage 24 inside the sample stage 7, and the temperature (1305) of the sample stage 7 and the electrostatic chuck 21 is set to a value within a temperature range for starting the process in a state in which the wafer 8 is placed thereon. Thereafter, direct-current voltages (1301, 1302) for electrostatic adsorption are applied to the inner electrode 22 and the outer electrode 23 in the electrostatic chuck 21, and due to the electrostatic force formed between these electrodes and the wafer 8, the wafer 8 is attracted and held above the upper side of the electrostatic chuck 21 (step S42).

Next, the controller 32 detects and checks whether or not the wafer 8 is adsorbed on the upper side of the electrostatic chuck 21 (step S43). For example, the lift pins 33 may be pressed against the back side of the wafer 8, and the reaction force may be detected by a detector attached to the driving device of the lift pins 33. Alternatively, the heat transfer gas is supplied into the heat transfer gas dispersion region through the heat transfer gas supply passage 25 to detect the pressure inside the heat transfer gas, and by detecting that the pressure value exceeds the predetermined value, the adsorption of the wafer 8 may be checked.

After the adsorption of the wafer 8 is checked, the supply of the heat transfer gas (1303) starts from the supply hole 26 to the space between the upper side of the electrostatic chuck 21 and the back side of the wafer 8 in accordance with a command signal from the control device 32 (step S44). That is, after the time t1 after starting the supply of the voltages (1301, 1302) for electrostatic adsorption to the inner electrode 22 and the outer electrode 23, the space from the supply hole 26 to the back side of the wafer 8 and the upper side of the electrostatic chuck 21 (1303) of the heat transfer gas is started. Alternatively, the flow rate and speed of the heat transfer gas supplied from the supply hole 26 may be increased after the time t1. When the amount and the speed of the supply of the heat transfer gas are increased, the reaction force due to the pressure of the heat transfer gas in the space is larger than the electrostatic force which is pressed in contact with the wafer 8 in the direction toward the upper side of the electrostatic chuck 21, and the reaction force causes the wafer 8 to flow from the upper side of the electrostatic chuck 21 (1304).

In this state, whether the wafer 8 is held above the upper side of the electrostatic chuck 21 (float) in the non-contact manner is detected in the control device 32, using a change in the pressure of the detection hole 30 detected from the output from the pressure sensor 31. That is, by detecting that the wafer 8 is rotating, it is determined whether or not the wafer 8 floats above the upper side of the electrostatic chuck 21 in a non-contact manner (step S45).

It is to be noted that while the wafer 8 is held above the electrostatic chuck 21 in a non-contact manner, the supply of the heat transfer gas is continued. Since the heat transfer is maintained between the wafer 8 and the sample stage 7 via the electrostatic chuck 21, the temperature (1307) of the wafer 8 is controlled to be within the sample stage 7 or within the refrigerant flow passage 24, and is maintained at a predetermined value within the allowable range.

Next, in this state, processing (in this example, etching process) of the film layer to be processed, which is arranged in advance on the upper side of the wafer 8, is executed according to the preset processing conditions. In the etching process of this example, a plurality of processes performed under a plurality of different process conditions are performed. In other words, plasma power (1309) is applied, while gas for specific processing is supplied (1310) to the inside of the processing chamber to perform plasma, the etching process for a predetermined period or amount is performed with respect to the film layer to be processed, and then, the process for the next process, which is set in advance, for example, the type of gas and the flow rate, is switched to another process, and the process of the next process is performed. During the plurality of processing steps, plasma is continuously generated, while supplying an inert gas (plasma gas) (1308) into the processing chamber in place of the processing gas of the previous step. During the period in which the plasma of the inert gas is being formed, preparing for realizing conditions for processing to be used in the next processing step for example, mixing of processing gas composed of a plurality of kinds of substances to be used with a predetermined composition or a change of pressure in the processing chamber is performed.

First, plasma is generated in the processing chamber (step S46). That is, after time t2 (time ta) after the supply (1303) of the heat transfer gas is started (increased), the generation gas (plasma gas) (1308) for generating plasma is performed in the processing chamber, and the wafer processing of the wafer 8 is started. Next, after the time t3 after the supply (1308) of the plasma gas is started, the supply of the high-frequency power (plasma power) (1309) for plasma generation to the induction coil 4 is started, and plasma is generated by the induced magnetic field is formed in the processing chamber 13.

Next, according to the conditions of the process of the process to be performed in the future, the composition of plural kinds of gases corresponding to the film layer to be processed and the temperature of the wafer 8 are changed as necessary and the processing of the wafer 8 is performed (step S47). For example, after the time t4 after the supply of the heat transfer gas or the increase thereof is started in the gap between the rear surface of the wafer 8 and the upper side of the electrostatic chuck 21 from the supply hole 26, the supply of DC power is started as a heater power (1306) to a film-shaped heater (not shown) to the inside of the sample stage 7 (for example, the inside of the refrigerant flow passage 24 of the base material which is a metallic circular plate on which the refrigerant flow passage 24 is disposed or inside the inside electrode 22 or the inside of the outside electrode 23 of the electrostatic chuck 21). Heat is transferred between the sample stage 7 or the electrostatic chuck 21 heated by supplying the heater electric power (1306) as the heater electric power for the heater and the wafer 8 via the heat transfer gas, and the temperature of the wafer 8 starts to rise from Te1 and reaches a predetermined value Te2 within the allowable range after the time t5 from the supply of the heater power (1306) which is electric power to the heater or the increase thereof, or the magnitude of the variation within the allowable range is detected by the control device 32, and is maintained to fall within the allowable range.

Further, in accordance with the supply of the heater power (1306), the processing gas A is supplied into the processing chamber 13 (1310). That is, the supply (1310) of the processing gas A from the shower plate (ground electrode) 3 into the processing chamber 13 is started at the time when the supply of the heater power (1306) is started, and the processing gas A is used to form the plasma. In addition, after the time t5 when the control device 32 detects that the temperature of the wafer 8 reaches a predetermined value or the magnitude of the variation is within the allowable range after the supply of the heater power (1306) or the increase thereof is started, the supply of the high-frequency power (1312) for forming the bias potential is started to the metallic base material inside the sample stage 7 or the film-like electrode arranged inside the electrostatic chuck 21 is started. By the supply of the high-frequency power (1312) for forming the bias potential, a bias potential determined between the electrostatic chuck 21 and the potential of the plasma in the processing chamber 13 is formed above the upper side of the wafer 8 above the electrostatic chuck 21, and the plasma gas ionized in the processing chamber 13 and the particles of the processing gas A are attracted to the upper side of the wafer 8 in accordance with the potential difference and are incident on the film to be processed, and the etching toward the incident direction proceeds.

In this example, the supply of the heater power (1306), which is DC power to the heater in the sample stage 7, is stopped and the supply of the processing gas A (1310) into the processing chamber 13 and the supply of the high-frequency power (1312) for forming the bias potential to the electrode in the sample stage 7 is also stopped. That is, in this example, the periods of heating of the wafer 8 by the heater, generation of plasma using the processing gas A, and the etching process performed by attracting charged particles in the plasma to the wafer 8 are performed synchronously.

Further, when the supply A of the processing gas (1310) is stopped, the processing gas A is replaced with the processing gas A, and the supply of the processing gas B (1311) from the shower plate 3 into the processing chamber 13 is started. During the period when the processing gas B is supplied, plasma is formed by using the processing gas B and the plasma gas in the processing chamber 13, the etching process of the film layer to be processed on the top surface of the wafer 8 is performed by interaction with atoms or molecules of the processing gas B ionized or dissociated, while the supply (1311) of the processing gas B is started, the supply of the stopped heater power (1306) at the time when the supply (1310) of the processing gas A is stopped is maintained in a stopped state, and the wafer 8 becomes a cooling period in which the temperature (1307) of the wafer 8 decreases to Te1 due to the heat transfer between the wafer 8 and the refrigerant flowing through the refrigerant flow passage 24 inside the sample stage 7.

After the supply (1311) of the processing gas B is stopped for a preset period, the supply (1311) of the processing gas B is stopped and the supply (1310) of the processing gas A is started again in place of the processing gas B. Further, at the same time as the supply of the processing gas A (1310) starts, the supply of the heater power (1306) which is DC power to the heater inside the sample stage 7, the supply of heater power (1306) which is direct current power to the heater inside the sample stage 7, and supply of high-frequency power (1312) for forming the bias potential to the electrode are restarted, and the step of synchronous processing of heating the wafer 8, plasma formation of the processing gas A, and etching process by the bias potential is started.

In this example, the two steps of processing of the film layer to be processed under the different processing conditions are repeated in the cycle T. That is, the period during which the wafer 8 is heated and the period in which the wafer 8 is subsequently cooled are cyclical (period T), the arrival at the target or the end point of the process described below is detected from the time to at which the supply of power to the heater or the increase of the power is started in a state in which the wafer 8 is held in a non-contact manner above the electrostatic chuck 21, and is repeatedly executed in a period until a time tb when the etching process of the film layer to be processed is stopped by a command signal from the control device 32.

During processing of the film layer to be processed of the wafer 8 of this example, an output from a sensor (not illustrated) as to whether or not the process has reached the target or the end point at predetermined time intervals is transmitted to the control device 32, and it is determined whether or not the processing is terminated (step S48). The arrival at the target of the processing on the wafer 8 in this example can be achieved by detecting a specific change with time of the intensity of the light emission of the plasma occurring during processing or by detecting an etching depth for the film layer to be processed and the remaining film thickness.

When the etching process is detected to reach the target or the end point, the back side of the wafer 8 and the upper side of the electrostatic chuck 21 are moved by the heat transfer gas discharge path 28 or the gas discharge device 29 based on the command signal from the control device 32, and thus, the discharge of the heat transfer gas which has been supplied is started, or the amount and the speed of the discharge are increased. As a result, the magnitude of the force acting upward on the back side of the wafer 8 is reduced by the pressure of the heat transfer gas, and the wafer 8 is brought close to and descended toward the upper side of the electrostatic chuck 21 (step S49). In accordance with a command signal from the control device 32, the amount and speed of discharge of the heat transfer gas are adjusted so that the wafer 8 is not attracted to the sample stage 7, and finally the heat transfer gas is supplied Is stopped. In this example illustrated in FIG. 13, the supply of the heat transfer gas is stopped after the time t6 from the time tb when the arrival at the end point of the etching process is detected, and the wafer 8 descends to the upper side of the electrostatic chuck 21.

The lowering and contact of the wafer 8 onto the upper side of the electrostatic chuck 21 are detected by the control device 32 by the fact that the control device 32 detects that the pressure value of the heat transfer gas between the rear side of the wafer 8 and the upper side of the electrostatic chuck 21 has become less than or equal to a predetermined value, using the output from the pressure sensor 31 (step S50). When the descent of the wafer 8 is detected, after the supply of the heat transfer gas to the upper side of the electrostatic chuck 21 is stopped, a step of eliminating static electricity for attracting and holding the wafer 8 on the electrostatic chuck 21 (step S51).

That is, after the time t7, reduction of the values of the voltages (1301, 1302) supplied to the inner electrode 22 and the outer electrode 23 is started, the plasma gas supply (1308) is stopped and the supply of the plasma power (1309) is stopped. During time t7, static elimination of the wafer 8 using plasma is performed. After the time t8 from the stop of the plasma power (1309), the application of the voltage (1301, 1302) for forming the electrostatic force to the inner electrode 22 and the outer electrode 23 is stopped. As a result, static elimination of the wafer 8 is performed, and the wafer 8 can be detached from the upper side of the electrostatic chuck 21 above the sample stage 7.

After completion of the neutralizing step, the wafer 8 is carried out from the inside of the processing chamber 13 by the operation opposite to the case where the wafer 8 is loaded (step S52), and the processing in the processing chamber 13 of the wafer 8 is completed.

In such a process, for example, if a gas having a high performance of etching the film layer to be processed having the film structure on the upper side of the wafer 8 is used as the processing gas A, and a gas having high performance for depositing particles on the surface of the film structure of the wafer 8 is used as the processing gas B, the etching process and the deposition process can be alternately performed on the film structure including the film layer to be processed on the upper side of the wafer 8, and by properly selecting the length of each of these processes, etching, deposition rate and time, it is possible to perform an etching process to obtain a shape with a high aspect ratio. Further, by using a gas that can promote anisotropic etching as the processing gas A and by using a gas that promotes isotropic etching for the processing gas B, it is also possible to perform the etching process with a complicated shape.

According to the above example, heat transfer gas is provided into the space between the back side of the wafer 8 electrostatically attracted to the upper side of the electrostatic chuck 21 on the sample stage 7 and the recessed portion 21' formed on the upper side of the electrostatic chuck 21, and an upward force due to the pressure of the heat transfer gas is caused to act on the electrostatic force for electrostatically chucking the wafer 8 to cause the wafer 8 to float above the top surface of the electrostatic chuck 21 within the mean free path of the heat transfer gas, the wafer 8 can be held in a non-contact manner, thereby making it possible to maintain the wafer 8 in a non-contact manner. With this configuration, by adjusting the temperature of the sample stage 7 to a value within a predetermined range, the temperature of the wafer 8 can be set to a value within a desired range for processing, and even if the magnitudes of thermal expansion differ between the wafer 8 and the sample stage 7 and both of them are heated to a high temperature, the sample stage 7 and the wafer 8 are prevented from making contact with each other and sliding, and generation of particles due to the sliding is reduced. Thus, in the plasma process in which the sample is processed under reduced pressure, the generation of particles due to the sliding is reduced, the temperature of the wafer 8 can be changed in a short time, and the throughput of the processing of the wafer 8 is improved.

Further, a heat transfer gas seal region is arranged in a ring-shaped region opposed to the outer circumferential part of the back side of the wafer 8 which is the outer circumferential side portion of the upper side of the electrostatic chuck 21 and held by electrostatic attraction, the heat transfer gas discharge path 28 including an opening is disposed in the region, and the heat transfer gas supplied to the top surface of the electrostatic chuck 21 through the heat transfer gas discharge path 28 is discharged to the outside of the vacuum chamber. Thus, leakage of heat transfer gas from the rear side of the wafer 8 into the processing chamber is prevented. Therefore, mixing of the heat transfer gas into the atmosphere of the processing gas supplied into the processing chamber in the vacuum chamber 1 is prevented, and a desired plasma processing can be performed on the wafer 8 as a sample.

By applying an electrostatic attractive force to the wafer 8 from an electrode for electrostatic attraction arranged in a region having substantially the same diameter as the diameter of the wafer 8, it is possible to give a so-called centering action to exert a force to reduce the displacing of the wafer 8 floating above the top surface of the electrostatic chuck 21. Furthermore, since the heat transfer gas is supplied from the vertical axis perpendicular to the upper side of the electrostatic chuck 21 in the direction inclined by a predetermined angle in the circumferential direction of the electrostatic chuck 21 or the wafer 8, the wafer 8 can be rotated in the direction in which the inclination is given to the wafer 8 floating above the top surface of the electrostatic chuck 21, the position of the floating wafer 8 can be stabilized and maintained in addition to the above configuration, and uniformity of processing on the top surface of the wafer 8 can be improved.

Further, the discharge amount of the heat transfer gas passing through the exhaust line of the heat transfer gas communicating with the through hole accommodating the lift pin 33 disposed in the heat transfer gas dispersion region on the upper side of the electrostatic chuck 21 is adjusted, and since it is possible to increase or decrease the supply amount of the heat transfer gas, while preventing the change in the pressure in the heat transfer gas dispersion region and preventing the change in the lifted height of the wafer 8, it is possible to adjust the increase and decrease of the speed (the number of revolutions per unit time) at which the wafer 8 rotates, further improving the uniformity of processing.

The above example discloses an example in which the electrostatic chuck 21 of the sample stage 7 is formed as a sintered body in which a metallic electrode for film electrostatic adsorption is disposed and fired, inside a configuration in which a dielectric material such as ceramics is formed in a circular plate or a cylindrical shape having a predetermined size and radius or diameter in the vertical direction, and a heat transfer gas dispersion region and a heat transfer gas seal region arranged in a ring shape on the outer circumferential side of the heat transfer gas dispersion region and having an top surface raised, and discharge passages of a plurality of heat transfer gas exhaust.

The sample stage or the electrostatic chuck according to a modified example of the above example will be described with reference to FIGS. 14A to 14D. FIGS. 14A to 14D are vertical cross-sectional views schematically illustrating the outline of the configuration of the sample stage of the wafer processing apparatus according to the modified example of the example illustrated in FIG. 1. In FIGS. 14A to 14D, in order to simplify the explanation, the electrostatic chuck and the electrode block described in the first embodiment are integrated and represented as an electrode block, and the display of the outer electrode and the inner electrode inside the electrostatic chuck is omitted.

Figure 14A:
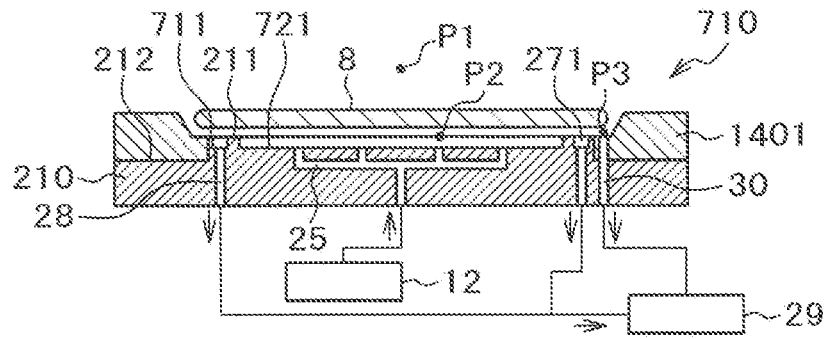
FIGS. 14A to 14D are vertical cross-sectional views schematically illustrating an outline of a configuration of a sample stage of a wafer processing apparatus according to a modified example of the example illustrated in FIG. 1.

In the sample stage 710 illustrated in FIG. 14A, a cylindrical protruding portion 711 whose position on the upper side is higher than the outer circumferential portion thereof is disposed in the center portion of the electrode block 210 of the sample stage 710, and the diameter of the wafer placing surface 211 which is the top surface of the projection 711 is made slightly smaller than the diameter of the wafer 8. A portion 212 where the upper side on the outer circumferential side of the convex portion 711 is low is a concave portion that forms a stepped step with the upper side of the convex portion 711, and a ring shaped focus ring 1401 (or a combination of a conductor and a cover made of a dielectric covering the upper part of the conductor) is disposed in the concave portion.

Further, on the upper side of the convex portion 711 constituting the wafer placing surface 211, a heat transfer gas dispersion region 761 having a recess in the center part, and a heat transfer gas seal region having a height of the top surface higher than the outer circumferential part of the wafer placing surface 211 are arranged on the outer circumferential side of the heat transfer gas dispersion region 761. Further, in the present modified example, the detection hole 30 is disposed at a position corresponding to the notch portion of the wafer 8 in a state in which the wafer 8 is placed on the inner circumferential end portion of the focus ring 1401 on the wafer placing surface 211. The detection hole 30 penetrates the focus ring 1401 and the electrode block 210 below the focus ring 1401 and is connected in communication with the gas discharge device 29, and the heat transfer gas in the gap formed between the wafer 8 and the focus ring 1401 is discharged through the detection hole 30.

Figure 14B:
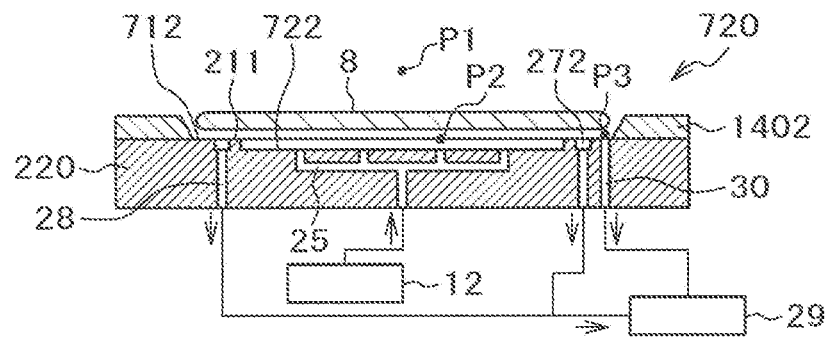

In the sample stage 720 illustrated in FIG. 14B, the top surface of the electrode block 220 is formed flat from the center to the outer circumferential edge, and similarly to the sample stage 710 in FIG. 14A, a heat transfer gas seal region 712 is disposed in the outer circumferential region of the wafer placing surface, and a recessed part serving as the heat transfer gas dispersion region 722 is disposed inside the same. Further, a ring-shaped focus ring 1402 (or a combination of a conductor and a dielectric cover covering the upper part thereof) is disposed on the top surface of the electrode block 220 surrounding the outer periphery of the heat transfer gas seal region 712 in a ring shape. On the other hand, the detection hole 30 is disposed at a lower position corresponding to the notch 8a of the wafer 8 placed on the center side of the inner circumferential edge of the focus ring 1402 placed on the top surface of the electrode block 220 and above the electrode block 220, and is connected to the gas discharge device 29 so as to communicate therewith.

Figure 14C:
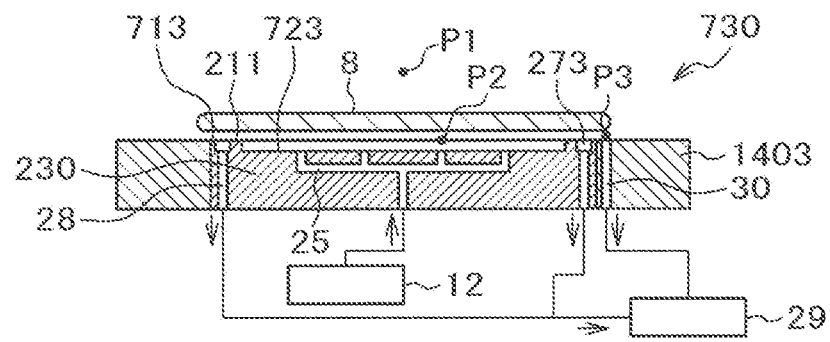
Figure 14D:
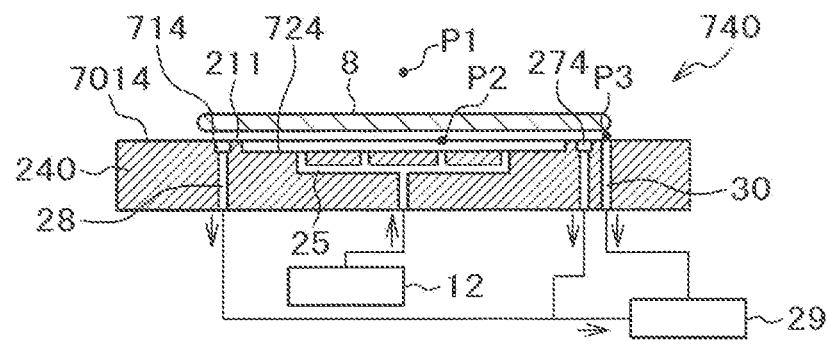

The sample stage 730 illustrated in FIG. 14C has a cylindrical or disc shape in which the electrode block 230 has a diameter slightly smaller than the diameter of the wafer 8, and a focus ring 1403 (or a cover) is disposed surrounding the outer circumference side of the side wall surface of the electrode block 230 in a ring shape. Further, on the top surface of the electrode block 230, a heat transfer gas seal region 713 having a convex portion on the outer circumferential portion of the wafer placing surface as in FIG. 14A is formed in the center side portion with a concave portion constituting the heat transfer gas dispersion region 723. Further, the outer circumferential edge portion of the wafer 8 is positioned outside the outer circumferential edge of the electrode block 230 in a state in which the wafer 8 is placed above the sample stage 730, and a detection hole 30 located at a lower position corresponding to the notch 8a is arranged to penetrate the focus ring 1403 or the cover.

In the sample stage 740 illustrated in FIGS. 14A to 14D, the electrode block 240 has a disk shape having a diameter larger than the diameter of the wafer 8, and a flat top surface 7014 from the center to the outer circumferential edge constitutes the wafer placing surface 714. In a state in which the concave portion 724 constituting a heat transfer gas dispersion region is placed on the center portion of the wafer placing surface 714 of the electrode block 240 on the wafer placing surface 714 on the outer circumferential side thereof, a heat transfer gas seal region is formed in a ring-shaped portion facing the outer circumferential edge portion of the back surface of the wafer 8, and a convex portion whose height is higher than the concave portion 724 is disposed. The configuration of the heat transfer gas dispersion region and the heat transfer gas seal region is the same as FIG. 14B including the heat transfer gas supply passage 25 and the heat transfer gas discharge path 28. Further, no members such as the focus ring 1401 are disposed on the outer circumferential side of the heat transfer gas seal region on the upper side of the ring-shaped electrode block 240 surrounding the heat transfer gas seal region.

Also in these configurations, in a state in which the heat transfer gas dispersion region and a heat transfer gas seal region are formed on the wafer placing surface, heat transfer gas is supplied to the back surface of the wafer 8 in the reduced pressure processing chamber, and the pressure of the heat transfer gas on the back side is evenly brought close to the in-plane direction so that the wafer 8 is floated above the top surfaces of the sample stages 710 to 740 and held in a non-contact manner, it is possible to process the upper side of the wafer 8.

Second Example

Figure 15:
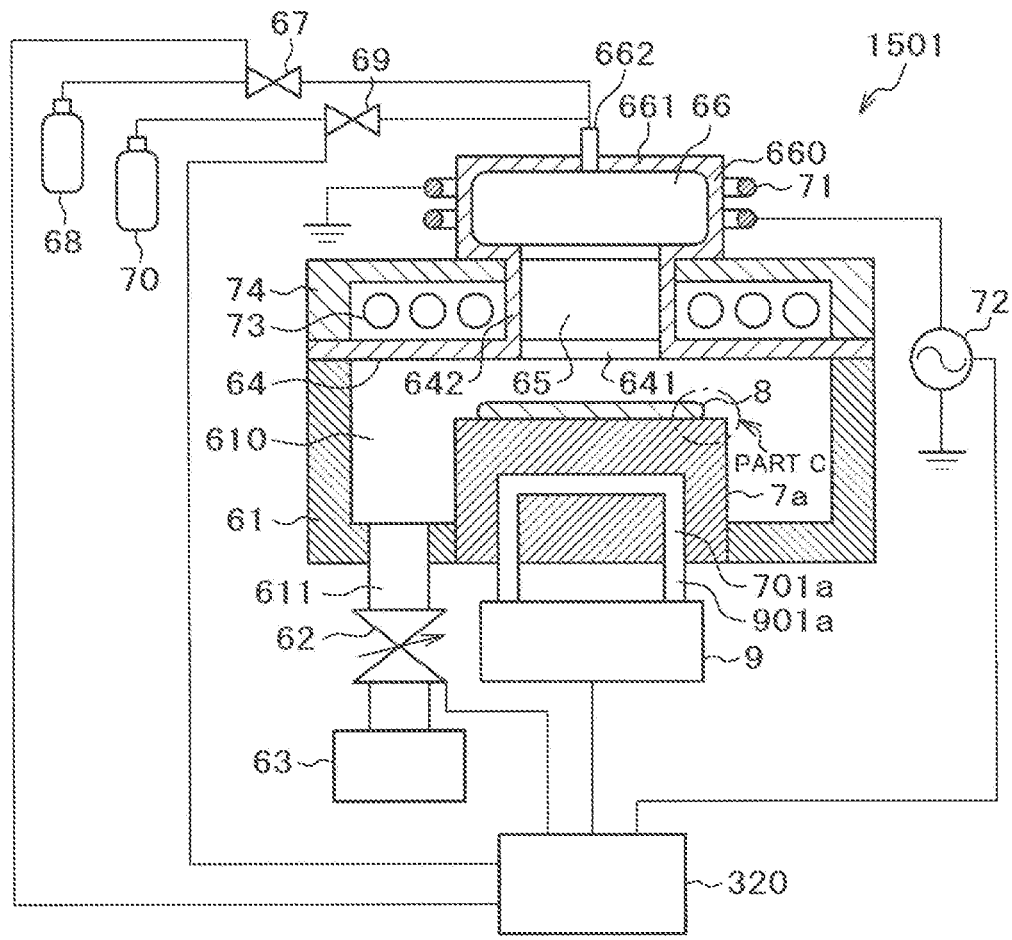
FIG. 15 is a vertical cross-sectional view schematically illustrating a schematic configuration of a wafer processing apparatus according to another example of the invention.

Next, a second example of the invention will be described with reference to FIGS. 15 to 19. FIG. 15 is a vertical cross-sectional view schematically illustrating the outline of the configuration of the wafer processing apparatus 1501 according to the second example of the invention. A wafer processing apparatus 1501 of this example is a so-called down flow type wafer processing apparatus that includes a plasma generation chamber (a discharge chamber) 66 disposed above a processing container 61 as a vacuum chamber and in which plasma is formed, and a processing chamber 610 which has a sample stage 7a in which the wafer to be processed is placed, and in which particles of dissociated gas are supplied as plasma is formed in the upper plasma generation chamber 66 and the film layer to be processed on the top surface of the wafer is processed.

The wafer processing apparatus 1501 of this example includes a processing container 61 which is a lower vacuum chamber having a cylindrical shape, and another vacuum chamber 660a constituting a plasma generation chamber 66 which is disposed above the processing container 61 and communicates with the inside of the processing container 61 and constitutes a plasma generation chamber 66 whose inside is decompressed. A through hole 611 constituting an opening communicating with the inside of the processing chamber 610 is disposed at the bottom of the processing container 61 constituting the lower vacuum chamber, and a vacuum exhaust device 63 is connected to the bottom surface of the processing container 61 via a pressure adjustment valve 62 so that the processing chamber 610 and the inlet of the vacuum exhaust device 63 communicate with each other through the through hole 611.

A top plate 64, which is a quartz disk and has a ceiling surface of the processing chamber 610 and an opening 641 at the center thereof, is disposed above the processing chamber 610 inside the processing chamber 61, and a processing chamber 61 on the upper end of the upper end of the side wall surface with a sealing member (not illustrated) interposed therebetween. A dielectric transparent cylindrical member 642 having an inner diameter of the same value as that of the opening 641 and having translucency is arranged on the upper side around the opening 641 in the central portion of the top plate 64. Further, above the upper end of the cylindrical member 642, a vacuum chamber 660 which is a cylindrical member whose diameter is larger than that of the cylindrical member 642 is placed with a sealing member (not illustrated) sandwiched therebetween, and the inside of the vacuum chamber 660 is air-tightly partitioned from the outer atmosphere to form a plasma generation chamber 66.

In the wafer processing apparatus 1501 of this example, the processing chamber 610 inside the processing container 61 which is the lower vacuum chamber, and the plasma generation chamber 66 inside the upper vacuum chamber 660 communicate with each other via a plasma transport path 65 which is a cylindrical passage inside the cylindrical member 642. It can be considered that the upper vacuum chamber 660 and the lower processing container 61 as a vacuum chamber and the cylindrical member 642 connecting them are air-tightly partitioned to constitute one vacuum chamber.

The cylindrical member 642 including the cylindrical plasma transport path 65 in this example is made of translucent quartz. The upper vacuum chamber 660 having the cylindrical shape constituting the plasma generation chamber 66 is provided with an induction coil 71 wound at least one stage or more in the vertical direction at a distance outside the cylindrical side wall surface. The induction coil 71 is electrically connected to the high-frequency power supply 72 via a matching unit (not illustrated), and supplied with high-frequency power to form an electric field for forming plasma in the plasma generation chamber 66. Therefore, at least a part of the side wall member constituting the inner wall surface of the plasma generation chamber 66 having a cylindrical shape is made of a dielectric material through which the electric field can pass.

At the center of the ceiling surface 661 of the plasma generation chamber 66, at least one introduction hole 662 through which processing gas or cleaning gas is introduced into the plasma generation chamber 66 is disposed. The introduction hole 662 is connected to a gas supply passage for each of the processing gas source 68, and is connected to the cleaning gas source 70 via the valve 69 and a flow control valve (not shown) via a valve 67 and a flow control valve by piping. In this example, in response to a command signal from the control device 320, the opening and gas-tight closing of the valve 67 and the valve 69 and further increase and decrease of the opening degree of each flow rate control valve connected to each are performed, 66 or the flow rate of the supply of each gas and its speed are adjusted.

The space inside the vacuum chamber made up of the processing chamber 610, the plasma transport path 65, and the plasma generation chamber 66 inside the processing container 61 are maintained at a pressure within a predetermined range due to a balance of the flow rate or the speed of the processing gas or the cleaning gas supplied to the inside of the plasma generation chamber 66 from the introduction hole 662 in accordance with the command signal from the control device 320 and the operation of the pressure adjustment valve 62 and the vacuum exhaust device 63, the flow rate and speed of exhaust of particles such as plasma or gas from the internal space. In this example, high-frequency power of 27.12 MHz is supplied as a frequency from the high-frequency power supply 72 to the induction coil 71.

In the wafer processing apparatus 1501 of this example, a heating lamp 73 surrounds the plasma transportation path 65 in the form of a ring around the plasma transportation path 65 below the top vacuum chamber 660 constituting the plasma generation chamber 66 above the top plate 64 is arranged. The heating lamps 73 are arranged in multiple concentric or spiral fashion around the central axis of the cylindrical plasma transport path 65. The plurality of heating lamps 73 of this example having multiple concentrically arranged configurations are electrically connected to a power supply (not illustrated), respectively, and are switched from a power supply to a power supply in accordance with a command signal from the control device 320, and the amount of electric power supplied is adjusted so that the amount of each or all of the heat generation can be controlled. A reflecting plate 74 is disposed so as to cover the heating lamps 73 on the upper side and the outer circumference side of the plurality of heating lamps 73 and reflects the radiation from the heating lamp 73 so as to irradiate the processing target wafer 8.

A sample stage 7a having a cylindrical shape on which the wafer 8 to be processed is placed is arranged on the upper central portion of the processing chamber 610 inside the processing container 61. A refrigerant flow passage 701a is disposed inside the sample stage 7a of this example, and an inlet and an outlet of the sample stage 7a are connected by a pipe 901 a constituting a supply pipe of a refrigerant to the refrigerant supply device 9, and a refrigerant which has been brought to a temperature within a predetermined range in the supply device 9 passes through the piping 901a, passes through the refrigerant passage 701a in the sample stage 7a, and returns to the refrigerant supply device 9 again, and the sample stage 7a is suitable for processing and is adjusted so as to have a temperature within a desired range.

The driving of the refrigerant supply device 9 or the setting of the temperature at which the refrigerant is adjusted is performed in accordance with a command signal from the control device 320. The processing chamber 61 and the processing chamber 610, the plasma transporting path 65, the plasma generation chamber 66, and the sample stage 7a inside the processing chamber 61 have cylindrical shapes, and the center axis of the processing chamber 610 and the placing surface of the wafer 8 of the sample stage 7a, and the center is arranged at a position approximate to the extent that it matches or is regarded as this in the vertical direction. In addition, the electrostatic chuck is not illustrated on the sample stage 7a of this example, and the configuration and operation such as electrostatic attraction of the wafer 8, supply of heat transfer gas, and the like are the same as those in the example, and thus, the description will not be provided.

Figure 16:
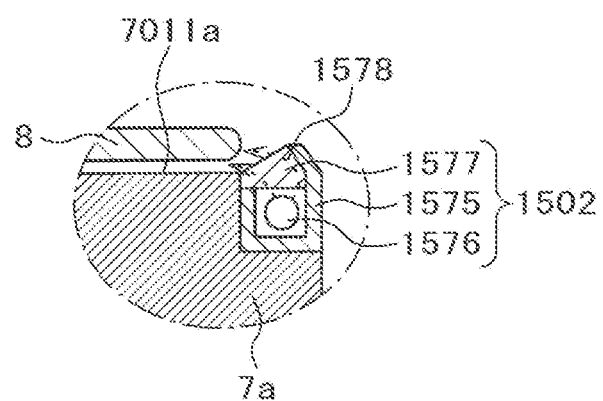
FIG. 16 is an enlarged vertical cross-sectional view schematically illustrating an outline of a configuration of a part C including a heating device for a wafer arranged on an outer circumferential portion of a sample stage of the plasma processing apparatus according to the example illustrated in FIG. 15.

Next, referring to FIG. 16, the configuration of the heating device provided on the outer circumferential side portion of the upper part of the sample stage 7a of the wafer processing apparatus 1501 of this example will be described. FIG. 16 is an enlarged vertical cross-sectional view schematically illustrating an outline of a configuration of a portion C including a heating device for a wafer arranged on an outer circumferential portion of a sample stage of the plasma processing apparatus according to the example illustrated in FIG. 15.

FIG. 16 illustrates a configuration for heating the back side of the outer circumferential side portion of the wafer 8 which is disposed at the outer circumferential end portion of the sample stage 7a of this example. The heating device 1502 of this example is configured to include a ring-shaped reflecting member 1575 arranged in a ring shape surrounding the wafer placing surface 7011a on the top surface of the sample stage 7a and having a recess or groove having an opening in the upper portion thereof, a ring-shaped heating lamp 1576 disposed in the recess of the reflecting member 1575, and a ring-shaped quartz window 1577 covering the upper portion of the heating lamp 1576 and closing the opening of the reflecting member 1575.

The upper part of the quartz window 1577 has an upper side which is inclined so as to be higher toward the outer circumferential side on the outer side of the rear surface of the outer circumferential end portion of the wafer 8. The infrared rays 1578 emitted from the heating lamp 1576 are directly or after being reflected on the inner wall surface of the concave portion of the reflecting member 1575 and then irradiated from the inclined surface of the quartz window 1577 to the rear surface of the outer circumferential end portion of the wafer 8.

Figure 17A:
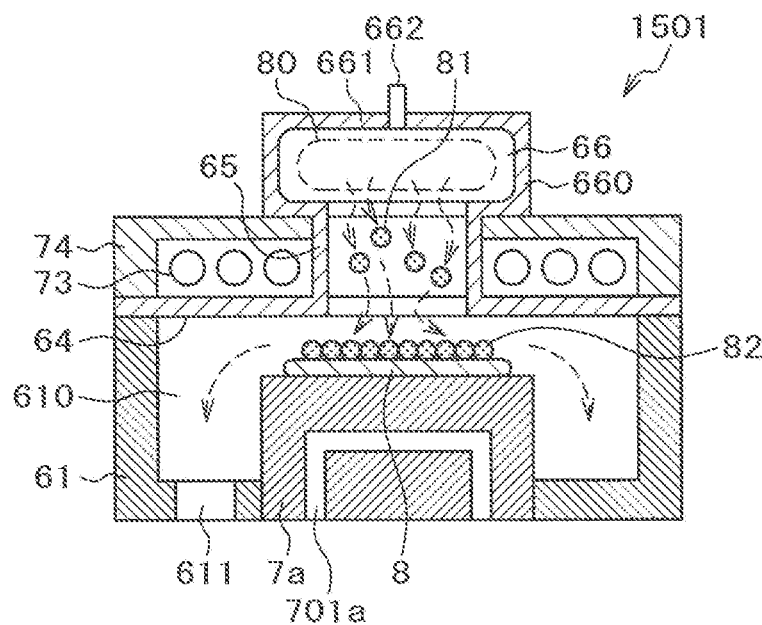
FIGS. 17A and 17B are vertical cross-sectional views schematically illustrating a state in which a wafer is being processed by the plasma processing apparatus according to the example illustrated in FIG. 15.
Figure 17B:
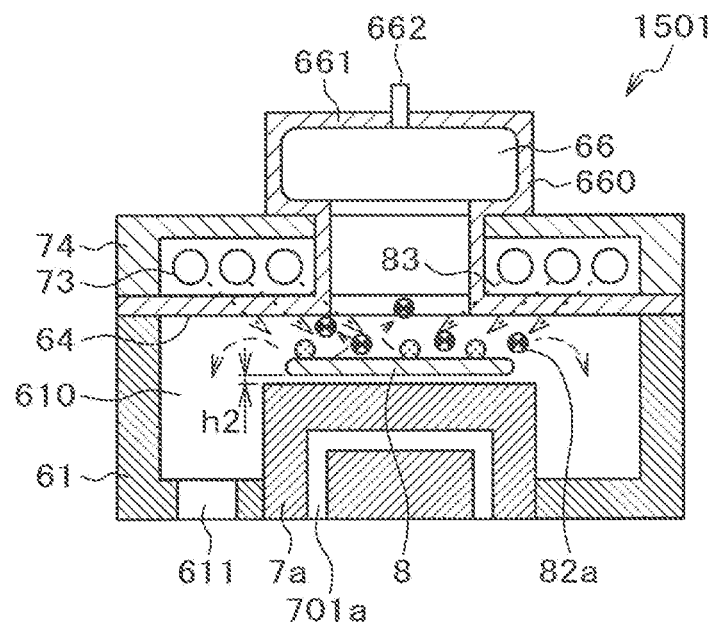
Figure 18:
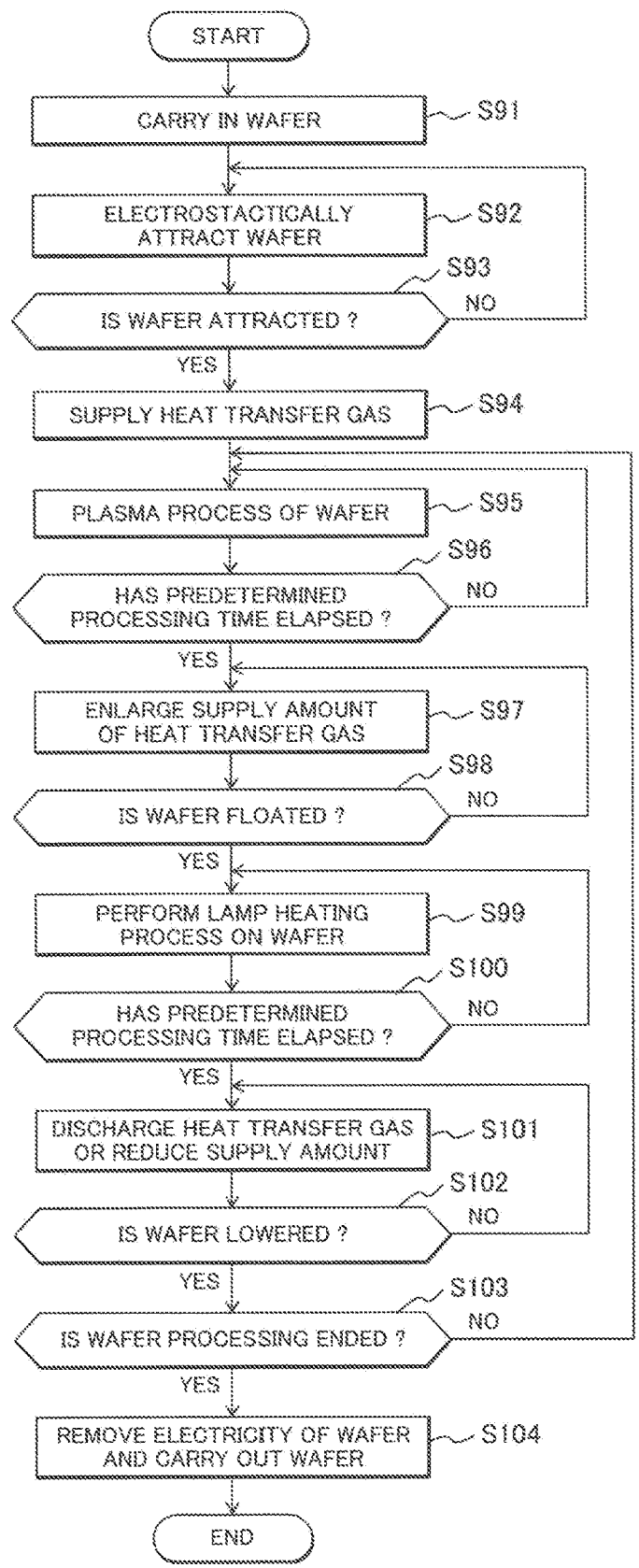
FIG. 18 is a flow chart schematically illustrating the flow of the operation of the plasma processing apparatus according to the example illustrated in FIG. 15.

Next, the operation of the wafer processing apparatus 1501 of this example will be described with reference to FIGS. 17 to 19. FIGS. 17A and 17B are vertical cross-sectional views schematically illustrating a state in which the wafer processing apparatus 1501 according to this example illustrated in FIG. 15 is processing a wafer 8. FIG. 18 is a flowchart schematically illustrating the flow of the operation of the wafer processing apparatus 1501 according to this example illustrated in FIG. 15.

Although not illustrated in the drawing, on the side wall of the processing container 61 of the wafer processing apparatus 1501 according to this embodiment, a wafer 8 placed in the inside of the reduced pressure transfer chamber and equipped with an arm part in which the end parts of the plurality of beam-shaped members are connected by a joint and expanding and contracting the arm part and placing the wafer 8, and another vacuum chamber in which a transport device such as a robot arm for transporting the substrate is disposed is connected. Prior to the processing of the wafer 8 in the wafer processing apparatus 1501, the wafer 8 held on the wafer holding section provided at the tip thereof by the rotation and extension of the arm (arm) of the transfer apparatus (not illustrated), and communicates between the container 61 and the transfer chamber and is transferred from the transfer chamber into the processing chamber inside the processing container 61 through the gate constituting the passage for transferring the wafer 8 (step S91), and in the same manner as in the example, is delivered onto a plurality of lift pins (not illustrated) protruding above the upper side of the sample stage 7a.

When the arm retracts from the processing chamber 610 after being shrunk, a plurality of lift pins (not shown) are moved downward and housed in a through-hole (not shown) formed inside the sample stage 7a, the wafer 8 is placed on the top surface of an electrostatic chuck (not shown) constituting the top surface of the sample stage 7a as in the first embodiment. In this state, As in the case of the first embodiment, DC power is supplied to the film-like electrode for electrostatic adsorption contained in the dielectric film constituting the top surface of the wafer placing surface of the electrostatic chuck (not shown) in the wafer 8 and electrostatically attracted and held on the dielectric film (step S92). Further, immediately after the arm (not illustrated) outlets, the gate valve disposed in the transfer chamber (not illustrated) is driven to air-tightly close the opening of the gate (not illustrated) on the transfer chamber side so that the processing chamber 610 and the inside thereof is evacuated by the operation of the vacuum evacuation device 63, and the inside thereof is evacuated to a predetermined degree of vacuum.

As in the example, whether or not the wafer 8 has been electrostatically attracted to the top surface of the sample stage 7a with a sufficient strength is detected (step S93). If it is insufficient, the process returns to step S92 and the value of the DC power supplied to the electrode for electrostatic adsorption is adjusted. Confirmation of electrostatic adsorption of the wafer 8 may be carried out, for example, by moving a lift pin (not shown) upward in the sample stage 7a and pressing it against the back surface of the wafer 8 to detect the magnitude of the reaction force, or as in the case of the first embodiment, it may be detected that the pressure in the heat transfer gas dispersion region of the heat transfer gas exceeds a predetermined value.

When it is detected that the wafer 8 is electrostatically attracted and held with sufficient strength, similarly to the case of the example, heat transfer gas flows between the back side of the wafer 8 and the wafer placing surface of the sample stage 7a (step S94). By the supply of the heat transfer gas to the gap between the wafer 8 and the sample stage 7a, the pressure of the heat transfer gas in the heat transfer gas dispersion region on the wafer placing surface of the sample stage 7a rises, and the refrigerant from the refrigerant supply device 9 is supplied to effectively transfer heat between the sample stage 7a and the wafer 8 which has been brought to a temperature within a predetermined range, and the temperature of the wafer 8 is close to the temperature of the sample stage 7a.

After it is detected that the temperature of the wafer 8 has reached the predetermined temperature, the process of the wafer 8 according to a preset recipe, that is, a process of forming a reaction layer on the surface of the film layer to be processed on the top surface of the wafer 8 is performed as illustrated in FIG. 17A (step S95).

That is, in a state in which the wafer 8 is sucked and held above the upper side of the electrostatic chuck (not illustrated), the valve 67 is opened and the flow rate and the speed of the processing gas from the processing gas source 68 are adjusted by a flow rate controller, and is supplied into the plasma generation chamber 66. In this example, the valve 69 is closed during the introduction of the processing gas. Further, high-frequency power is supplied from the high-frequency power supply 72 to the induction coil 71, and as illustrated in FIG. 17A, plasma 80 of the processing gas is generated in the plasma generation chamber 66 by atoms or molecules of the processing gas which is excited, ionized, and dissociated. Further, the particles of the plasma 80 in the plasma generation chamber 66 descend through the plasma transport path 65 and flow into the processing chamber 610 inside the processing chamber 61.

A part of the radical species 81 of plasma flowing toward the wafer 8 held on the wafer placing surface of the sample stage 7a disposed directly below the lower end of the plasma transport path 65 is transferred to the surface of the film to be processed on the wafer 8, and processing of the surface of the film layer is performed (step S95). That is, the material on the surface of the film layer reacts with the radical species 81 to form a reaction product 82, and the reaction product 82 is laminated as a reaction layer on the surface of the film layer to be treated on the upper side of the wafer 8. On the other hand, the other portion of the radical species 81 in the plasma 80 flowing into the processing chamber 610 passes between the inner side wall of the processing chamber 610 and the outer circumferential side wall of the sample stage 7a and moves to the lower side of the sample stage 7a, and is exhausted to the outside from the exhaust opening disposed on the bottom surface of the processing chamber by the operation of the vacuum exhaust device 63.

Whether or not a predetermined time has elapsed since the start of the plasma process is determined by the control device 320 (step S96). If the predetermined time has not elapsed, the process returns to step S95 and the plasma process is continued. On the other hand, if it is determined that the elapsed time has passed, the flow shifts to step S97, and the flow rate and the speed of the heat transfer gas supplied to the heat transfer gas dispersion region on the back side of the wafer 8 are increased. That is, in a state in which the wafer 8 is electrostatically attracted above the placing surface of the sample stage 7a, the supply of the heat transfer gas is adjusted to further increase the pressure of the heat transfer gas to the back side of the wafer 8, the electrostatic attractive force acts on the wafer 8, and an upward force larger than the attractive force acts on the rear surface of the wafer 8 to float the wafer 8 from the upper side of the sample stage 7a.

At this time, as in step S45 illustrated in FIG. 12, whether or not the wafer 8 has floated with the heat transfer gas in the control device 320 is detected (step S98). When it is determined that the wafer 8 is not floating (in step S98 NO), the flow returns to step S97, and the supply amount of the heat transfer gas is further increased. As in the first example, Detection of the floating of the wafer 8 is performed by the change in pressure of the detection hole (corresponding to the detection hole 30 illustrated in FIGS. 2 and 3 in the first embodiment) due to a pressure sensor (corresponding to the pressure sensor 31 shown in FIG. 1 in the first embodiment) (not shown) arranged on the sample stage 7a. That is, the control device 320 that receives the output of the pressure sensor detects the rotation of the wafer 8, thereby determining the floating of the wafer 8 (step S98).

When it is determined that the wafer 8 has floated, the flow rate and speed of the heat transfer gas to be supplied are adjusted so as to be within a predetermined allowable range according to the command signal from the control device 320, while the wafer 8 is held in a non-contact manner with a gap of size h2 from the upper side of the sample stage 7a, the process proceeds to step S99, and the heating process of the wafer 8 is started according to a preset recipe.

In step S99, the reaction layer of the reaction product 82 is held under the outer circumferential edge of the wafer 8 on the upper side of the sample stage 7a, with the wafer 8 formed on the surface of the film layer to be processed held non-contact above the sample stage 7a, and the infrared rays 1578 are radiated from the heating lamp 1576 and are irradiated to the rear surface of the outer circumferential end portion of the wafer 8. Next, after a predetermined time from the start of irradiation of the infrared rays 1578 from the heating lamp 1576, infrared rays 83 are radiated from the heating lamp 73 and are irradiated onto the upper side of the wafer 8. As a result, since the infrared rays 1578 first heat the rear surface of the outer circumferential portion of the wafer 8, the outer circumferential portion of the outer circumferential portion of the wafer 8 warps upward due to the temperature difference between the back side and the upper side thereof.

The infrared ray 83 emitted from the heating lamp 73 is directly reflected or reflected by the reflecting plate 74 and passes through the quartz top plate 64 and the cylindrical member 642 constituting the plasma transporting path 65 to enter the processing chamber 610, and is radiated onto the upper side of the wafer 8. The temperature of the surface of the wafer 8 irradiated with the infrared rays 83 rises. At this time, the upper side of the wafer 8 on the side of the heating lamp 73 is heated, the temperature of the wafer 8 rapidly increases, and the temperature of the wafer 8 curves convexly to bend due to the difference with the temperature of the lower surface. However, since the outer circumferential portion of the wafer 8 is warped in a concave shape or warped upward due to the heating from the heating lamp 1576 in advance, warpage that the height of the central portion of the wafer 8 due to infrared irradiation from the heating lamp 73 becomes higher than the outer circumferential portion is prevented or relaxed. Thereafter, as the heat is also transferred to the lower surface side of the wafer 8 and the distribution of the temperature of the entire wafer 8 approaches uniformly, the warpage of the wafer 8 is eliminated or becomes small to a negligible degree.

The temperature of the upper side of the wafer 8 rises by heating from the heating lamp 73, reaching the temperature at which the reaction product 82 in the reaction layer on the upper side of the film layer to be treated is decomposed and detached from the surface. Like the particles of the plasma supplied into the processing chamber 610 from the position above the top surface of the wafer 8, the particles of the reaction product 82a staying above the top surface of the wafer 8 in the processing chamber move to the space between the outer circumference side wall surface of the sample stage 7a and the side wall surface of the processing chamber 610 to form the top surface of the sample stage 7a, and is exhausted to the outside of the processing chamber through the vacuum exhaust device 63. When the wafer 8 is being heated by the lamp, when the wafer 8 is rotated, variations in heating or temperature in the circumferential direction of the upper side of the wafer 8 are reduced, and treatment of the film layer more uniformly in the circumferential direction is possible.

Further, the infrared rays 83 irradiated from the heating lamp 73 may be not only irradiated continuously, but also may be repeatedly increased or decreased in terms of radiation and stop or radiation amount at predetermined intervals. In this case, warpage of the wafer 8 can be effectively prevented by preventing the temperature difference from rapidly increasing in the in-plane direction of the upper side of the wafer 8.

Next, it is determined whether or not a predetermined time has elapsed since the heating of the wafer 8 in step S99 was started (step S100). If it is determined that the predetermined time has not elapsed (NO in S100), the process returns to step S99 to continue the lamp heating process, and if it is determined that the predetermined time has elapsed (YES in S100), The process proceeds to step 101, the process of lamp heating the wafer 8 is stopped, and the process of lowering the wafer 8 to the upper side of an electrostatic chuck (not illustrated) is started.

That is, when the control device 320 detects the end of the process of removing the reaction product 82a of the reaction layer and removing it from the surface of the wafer 8 after a predetermined time has elapsed from the start of heating the wafer 8, from the control device 320, the discharge of heat transfer gas in the gap between the back side of the wafer 8 and the upper side of the electrostatic chuck not illustrated is started or its discharge amount is increased and the pressure of the heat transfer gas in the gap is reduced, and the wafer 8 is lowered (step S101). At this time, in order to avoid collision or abrupt adsorption on the top surface of the electrostatic chuck (not shown) due to the sudden descent of the wafer 8, the flow rate and the speed of supply of the heat transfer gas in an amount within a predetermined range Reduction is performed, and finally the supply of the heat transfer gas is stopped.

Meanwhile, the controller 320 determines whether or not the wafer 8 is lowered and mounted in contact with the upper side of an electrostatic chuck (not illustrated) (step S102). In the same manner as in step S98, this determination is made by using a pressure sensor (not illustrated) to detect the pressure of the heat transfer gas in the detection hole (not illustrated), and it is determined whether or not this is equal to or less than a predetermined value. When it is determined that they are not in contact with each other (NO in S102), the process returns to step S101 and the discharge of the heat transfer gas or the reduction of the supply amount is continued. On the other hand, when it is determined that the pressure of the heat transfer gas has reached or exceeded the predetermined value (YES in S102), it is detected that the wafer 8 is mounted in contact with an electrostatic chuck (not illustrated).

After descent of the wafer 8 to the upper side of the electrostatic chuck (not illustrated) of the wafer 8 is detected, it is determined whether the processing of the wafer 8 has ended, that is, formation of a reaction layer on the surface of the film layer to be processed on the upper side of the wafer 8, and it is determined whether removal has ended (step S103). This determination is made by determining whether or not the number of repetitions of the counted reaction layer formation or reaction layer removal step has reached a predetermined value or the thickness from which the reaction layer has been removed and the remaining thickness of the reaction layer are detected and it is detected whether or not the value of the thickness has reached a preset value or less. When it is determined that the processing of the wafer 8 has not been completed (NO in S103), the process returns to step S95 and the process of again processing the wafer 8 from the formation of plasma in the plasma generation chamber 66 is repeated.

On the other hand, when it is detected that the processing of the wafer 8 is finished (YES in S103), the supply of the heat transfer gas to the gap between the rear surface of the wafer 8 and the top surface of the electrostatic chuck (not shown) is stopped in response to the command signal from the control device 320. Further, after a step of removing static electricity between the wafer 8 and an electrostatic chuck (not illustrated) is performed on an electrode for electrostatic chucking in an electrostatic chuck (not illustrated), the wafer 8 is delivered from the sample stage 7a to a conveyance device (not illustrated) to be carried out to the outside of the processing chamber 610 (step S104) in accordance with a procedure reverse to the operation of the operation of the wafer 8, and the entire process on the wafer 8 is completed.

In the wafer processing apparatus 1501 of this example, in a state in which the wafer 8 is not placed on the sample stage 7a, a cleaning step is carried out to reduce deposits on the surface of the inside of the processing chamber so as to bring the surface closer to the state before the start of the processing of the wafer 8. That is, the valve 69 is opened and a cleaning gas from the cleaning gas source 70 whose flow rate and speed are controlled by a flow rate controller not shown is supplied into the plasma generation chamber 66, and high-frequency power is supplied from the high-frequency power supply 72 to the induction coil 71 to generate plasma using the cleaning gas in the plasma generation chamber 66. The plasma particles of the cleaning gas descend into the processing chamber 610 inside the processing chamber 61 through the plasma transport path 65 and are supplied (down-flowed).

Due to the chemical reaction with the radical species in the plasma of the transported cleaning gas or with the gas molecules in the plasma, the reaction product formed during the processing of the wafer 8 and adhering or staying on the surface of the member constituting the inner wall of the processing chamber 610 is desorbed from the surface and is evacuated from the processing chamber 610 and exhausted to the outside by the operation of the vacuum exhaust device 63. In this cleaning process, the valve 67 is closed. In addition, the inner surface of the processing chamber may be heated at a different temperature from that of the step S99 in which electric power is supplied to the heating lamp 73 to radiate infrared rays to heat the wafer 8.

Such a cleaning process is performed after the process of detaching the reaction layer on the upper side of an arbitrary wafer 8 is completed and the wafer 8 is carried out of the processing chamber 610, and thus, it is possible to keep the inner surface of the processing chamber 610 closer to the start of processing of the arbitrary wafer 8 before starting the processing of the next wafer 8. Alternatively, a plurality of sheets having film structures each having a structure approximate to the surface to be considered the same or the same as each other and having processing conditions (recipe) approximated to be considered the same or the same in the wafer processing apparatus 1501 are set and processed assemble one wafer 8 as one lot, and a cleaning process may be performed before or after the process on the lot is started.

When the cumulative value of the number of wafers 8 to be processed in the wafer processing apparatus 1501 and the accumulated value of the processing time exceeds a predetermined value, after the operation of processing the wafer 8 by the wafer processing apparatus 1501 is stopped and the interior of the processing container 61 is brought to the atmospheric pressure and opened, and the maintenance and inspection work, the inside of the processing container 61 is sealed again, the pressure is reduced to a high degree of vacuum, and the processing of the wafer 8 is restarted, the cleaning step may be performed in order to clean the state of the inner wall surface of the processing chamber 610 and bring the temperature closer to that suitable for the start of processing.

Figure 19:
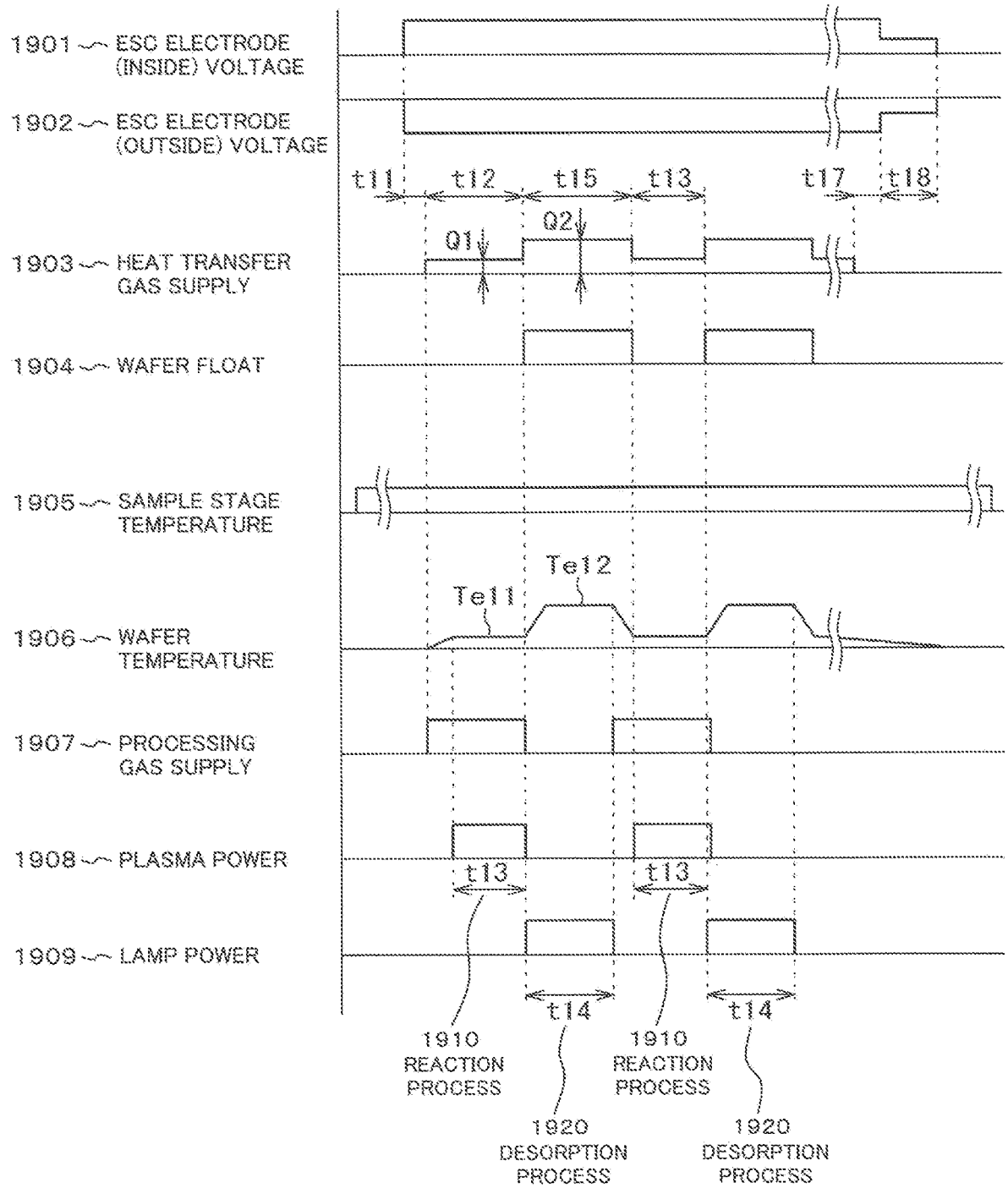
FIG. 19 is a time chart illustrating the operation of each part with the lapse of time when the plasma processing apparatus according to the example illustrated in FIG. 15 processes the wafers in accordance with the flowchart of FIG. 18.

FIG. 19 is a time chart illustrating the operation of each part with the lapse of time when the wafer processing apparatus 1501 according to this example illustrated in FIG. 15 processes the wafer 8 according to the flowchart of FIG. 18.

In step S92 of FIG. 18, in a state in which the wafer 8 is placed on the upper side of an electrostatic chuck (not illustrated), in order to electrostatically attract the wafer 8, it is an electrostatic chucking electrode in an electrostatic chuck In order to give different polarities to the inner electrode (corresponding to the inner electrode 22 in the example) and the outer electrode (corresponding to the outer electrode 23 in the example), positive and negative different DC voltages are applied by 1901 and 1902. Prior to the start of this step, the refrigerant having a temperature within a predetermined range in the refrigerant supply device 9 is supplied to the refrigerant passage 701a inside the sample stage 7a and is circulated, and the temperature (1905) of the sample stage 7a is adjusted to a value within a range suitable for the start of processing.

After the application of the voltage for electrostatic adsorption of the wafer 8 to the inner electrode and the outer electrode of the electrostatic chuck (not illustrated) is started and time t11 elapses, the heat transfer gas is transferred to the heat transfer gas dispersion Heat transfer gas supply (1903) is started at the flow rate Q1 into the recess forming the region. Heat transfer between the sample stage 7a and the wafer 8 is promoted by supply of the heat transfer gas (1903) between the upper side of the electrostatic chuck 21 and the back side of the wafer 8, and the temperature (1906) of the wafer 8 is measured and is maintained at a value (first temperature Te11) approximate to the temperature of the base 7a. In addition, in this example, the supply of the heat transfer gas (1903) after the elapse of the time t11 from the application of the voltage for electrostatic adsorption and the supply of the heat transfer gas to the plasma generation chamber 66 from the processing gas source 68 is started.

After it is detected by the control device 320 that received the output from a temperature sensor (not illustrated) disposed in the sample stage 7a that the temperature (1906) of the wafer 8 reaches the first temperature Te11, the high-frequency power (plasma power 1908) from the high-frequency power supply 72 is supplied to the induction coil 71, and the high frequency electric field for plasma generation is introduced into the plasma generation chamber 66 to generate the plasma 80. The generated plasma 80 is lowered and introduced into the processing chamber 610, and a process of forming a reaction layer on the surface of the wafer 8 placed on the sample stage 7a is performed. The reaction step 1910 for forming this reaction layer is performed for a time t13 which is a period during which high-frequency power for plasma formation (plasma power 1908) is supplied. In the reaction step 1910, the supply of the processing gas (1907) is also stopped as the supply of the high-frequency power (plasma power 1908) for plasma formation is stopped, and the reaction step 1910 is terminated.

The time t12, which is a period during which the heat transfer gas of the present embodiment is supplied at the flow rate Q1, is the time required for the temperature of the wafer 8 to reach the first temperature Te11 after the supply of the heat transfer gas (1903) is started is set equal to or longer than the sum of the time t13 and the time t13. Further, the supply of the processing gas (1907) to the plasma generation chamber 66 is started in synchronization with the start of the supply of the heat transfer gas (19003) and is performed for the period of time t12. That is, from the step S94 in which the supply of the heat transfer gas (1903) is started to the end of the plasma process (reaction step 1910) of the step S95 of forming the reaction layer on the surface of the film layer to be processed on the top surface of the wafer 8 is performed at the time t12.

When it is detected by the control device 320 that the time t12 has elapsed since the supply of the heat transfer gas (1903) has elapsed and the reaction process 1910 has ended, in response to the command signal from the control device 320, step S97 is performed such that the supply of the heat transfer gas (1903) is increased to Q2 and supplied to the heat transfer gas dispersion region. In this step, the wafer 8 floats from the upper side of the electrostatic chuck (not illustrated) (1904) and is held above the electrostatic chuck in a non-contact manner. Next, when floating and rotation of the wafer 8 are detected in step S98, power (lamp power 1909) is supplied to the heating lamps 73 and 1576 in step S99, and the reaction layer on the upper side of the wafer 8 is heated and desorbed (desorption step 1920) is started.

In desorption step 1920, the wafer 8 is irradiated with infrared rays radiated from the heating lamps 73, 1576 and maintained at a preset predetermined temperature (second temperature Te12). The desorption step 1920 of this example is performed for a period of time t14 from the time when the flow rate of the heat transfer gas in the heat transfer gas supply 1903 is increased to Q2. After the control device 320 determines in step S100 that the time t14 has elapsed, the supply of the lamp power (1909) is stopped in response to the command signal from the control device 320, the heating of the wafer 8 is stopped and the temperature of the wafer 8 (1906) drops to the first temperature Te11.

Further, supply of the processing gas (1907) to the plasma generation chamber 66 is restarted with the stop of the lamp power (1909). As the lamp power (1909) is stopped, the temperature of the wafer 8 decreases from the second temperature Te11 to approach the first temperature Te11 approximate to the temperature (1905) of the sample stage 7a. When the controller 320 detects that the temperature of the wafer 8 has reached the first temperature Te11 or a temperature close to the first temperature Te11, in step S101, the amount of the heat transfer gas supply (1903) is returned to the flow rate Q1 again. By setting the supply amount of the heat transfer gas to Q1, the wafer 8 descends and comes into contact with the electrostatic chuck (not illustrated) of the sample stage 7a.

In this example, the supply amount of the heat transfer gas in the heat transfer gas supply (1903) increases to the flow rate Q2, and the wafer 8 floats above the electrostatic chuck (not illustrated) (wafer floating: 1904) static time t15 held in a non-contact manner with the electrostatic chuck, the time t14 of the desorption process 1920 and the lamp power (1909) are applied, the heating by the heating lamp 73 is completed, and the wafer 8 returns to the first temperature Te11 of the time required for adding the time to the sum of the time required for the addition.

In step S102, when the control device 320 detects that the wafer 8 descends and contacts the electrostatic chuck (not illustrated), the control device 320 detects that the wafer 8 is sucked and held, and the temperature of the wafer 8 reaches the first temperature Te11, the control device 320 determines whether the processing of the wafer 8 is completed in step S103. As a result of the determination, when it is determined that the process is not finished (NO in S103), the process returns to step S95, and similarly to the previously performed reaction process 1910, high-frequency power for plasma generation (plasma power 1908) is supplied to the induction coil 71 to form plasma 80 using processing gas in the plasma generation chamber 66, and a reaction process 1910 for forming a reaction layer on the surface of the wafer 8 is performed. The reaction step 1910 is performed for a preset time t13 in the same manner as that performed previously, and the supply of the processing gas (1907) is also stopped along with the supply stop of the plasma power (1908).

Note that when the reaction step 1910 of steps S95 and S96 is performed again after the desorption step 1920 performed in steps S99 and S100, the heat transfer gas is supplied at the flow rate Q1 in the heat transfer gas supply (1903) The time is carried out only for the time t13, not at the time t12 in the first reaction step 1910. That is, the desorption process 1920 and the reaction process 1910 performed after the reaction process 1910, which is performed first after the start of the processing of the wafer 8, are performed by switching only the time t15 and the time t13, respectively.

In step S103, when the control device 320 detects that the number of times of the counted reaction step 1910 and desorption step 1920 has reached a predetermined value or the processing amount (depth or removal amount) of the processing target film layer on the top surface of the wafer 8 or the remaining film thickness reaches the target, the processing of the wafer 8 is completed, the heat transfer gas to the gap between the back surface of the wafer 8 and the electrostatic chuck (not shown) is stopped in response to the command signal from the control device 320 (1903). After the stop time t17, the values of the DC power 1901 and 1902 applied to the inner electrode and the outer electrode of the electrostatic chuck (not shown) are reduced, and a step of charge elimination such as supply of a voltage of a polarity different from that during the processing of the wafer 8 is performed as necessary, and then a DC voltage to the inner electrode and the outer electrode of the electrostatic chuck is stopped. After this neutralization step, the amount of static electricity accumulated between the electrostatic chuck (not illustrated) and the wafer 8 is reduced and the wafer 8 can be easily detached from the upper side of the electrostatic chuck (not illustrated).

As described above, in this example, in the reaction step 1910 and the desorption step 1920, the contact of the wafer 8 with the electrostatic chuck (not illustrated) and the flow of the floating and transfer heat gas are switched. That is, in the reaction step 1910, the wafer 8 is attracted to an electrostatic chuck (not illustrated), heat transfer gas is supplied between the wafer 8 and the electrostatic chuck at a flow rate Q1, the wafer is kept at a predetermined temperature Te11 Processing was done while doing. On the other hand, in the desorption step 1920, in a state in which the flow rate of the heat transfer gas is increased to Q2 to raise the wafer 8 from the electrostatic chuck (not shown), heated by heating lamps 73 and 1576, and the temperature of the wafer 8 set to Te12, the processing of the wafer 8 is performed.

In FIG. 19, the timing of adsorption and holding of wafer 8, confirmation of floating and descent, and end determination of processing are not displayed. In this example, confirmation of adsorption and retention of the wafer 8 is performed during the time t11 when the supply of the heat transfer gas (1903) is sustained for the first time. The confirmation of the floating of the wafer 8 is performed after the supply of the heat transfer gas of the flow rate Q2 (1903) and before the supply of the lamp power (1909). Confirmation of the descent of the wafer 8 in the wafer levitation (1904) is performed before supplying the plasma power (1908) after the supply (1903) of the heat transfer gas of the flow rate Q1.

The determination of the end of the wafer processing in S103 is performed after the completion of the desorption process 1920, before the process of the wafer 8 is continued and the processing gas is supplied (1907). Therefore, upon termination of the wafer processing, when it is determined that the desorption step 1920 is finished and the wafer processing is completed, supply of the processing gas to be next performed (1907) is stopped and waiting for the temperature (1906) of the wafer 8 to return to the set temperature (1905) of the sample stage, change the supply (1903) of the heat transfer gas to the flow rate Q1, lower the wafer 8, confirm the descent of the wafer 8, and stop supplying the heat transfer gas (1903).

According to this example, while the heat transfer gas is supplied to the back side of the wafer 8 electrostatically attracted to the sample stage 7a to float the wafer 8 above the upper side of the electrostatic chuck 21 kept in a non-contact manner, heating of the wafer 8 by lamp heating and removal of the film layer on the surface of the wafer 8 by this heating are performed. In the process of removing the film layer by such heating, the sliding of the back side of the wafer 8 due to the difference in thermal expansion between the wafer 8 and the electrostatic chuck (not illustrated) or the upper side of the sample stage 7a is prevented. In addition, since the heating by the lamp is stopped and the temperature of the wafer 8 is lowered while the wafer 8 is floated and held in a non-contact manner, even when the wafer 8 is lowered and placed on the sample stage 7a, the wafer 8 is prevented from sliding.

Therefore, occurrence of particles due to sliding is reduced. Thus, in the wafer processing apparatus 1501 that processes the wafer 8 under reduced pressure, the heating of the wafer 8 can be performed in a short time, and the throughput of processing can be improved.

Further, according to this example, since the sample stage similar to that of the example is used, the outflow of the heat transfer gas into the processing container can be prevented, so that the influence of the heat transfer gas to the wafer processing can be prevented and a desired process can be carried out. Further, in the step of heating the wafer 8, by heating the entire outer circumferential side portion of the wafer 8 and then heating the entire upper side of the wafer 8, the warp of the wafer 8 at the time of heating the wafer 8 is generated or the amount thereof is reduced and the contact between the wafer 8 and the top surface of the sample stage 7a or the electrostatic chuck 21 is prevented even when the floating amount of the wafer 8 is small.

Modified Example 1

Figure 20:
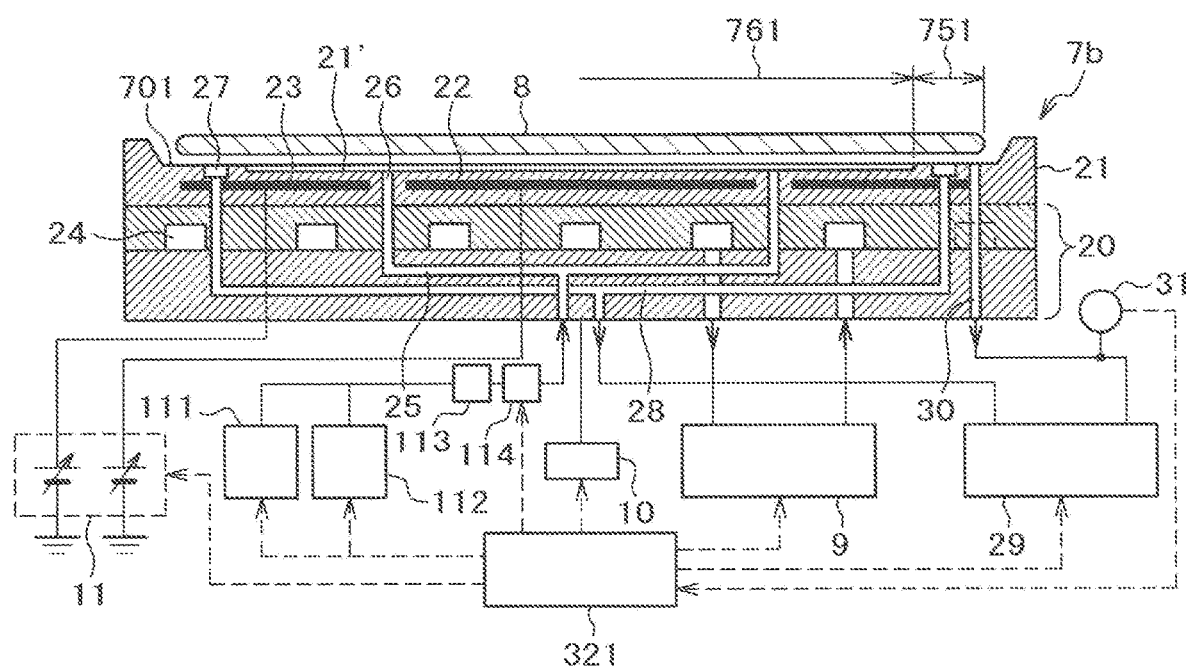
FIG. 20 is a vertical cross-sectional view schematically illustrating a schematic configuration of a sample stage of a wafer processing apparatus according to still another example of the invention.

Next, a first modified example of the second example of the invention will be described with reference to FIGS. 20 to 22. FIG. 20 is a vertical cross-sectional view schematically illustrating the outline of the configuration of the sample stage 7b according to this variation. The wafer processing apparatus in this modified example is obtained by replacing the sample stage 7a in the wafer processing apparatus 1501 described in the second example with the sample stage 7b illustrated in FIG. 20, and the other part of the wafer processing apparatus has the same configuration, the configuration of the wafer processing apparatus 1501 described with reference to FIGS. 15 to 17 in the second example is the same as that of the second example, and thus the description thereof will not be provided. Further, the configuration of the sample stage 7b illustrated in FIG. 20 can also be applied to the wafer processing apparatus 100 of the example by replacing the sample stage 7 of the wafer processing apparatus 100 illustrated in FIG. 1 described in the example.

Figure 21:
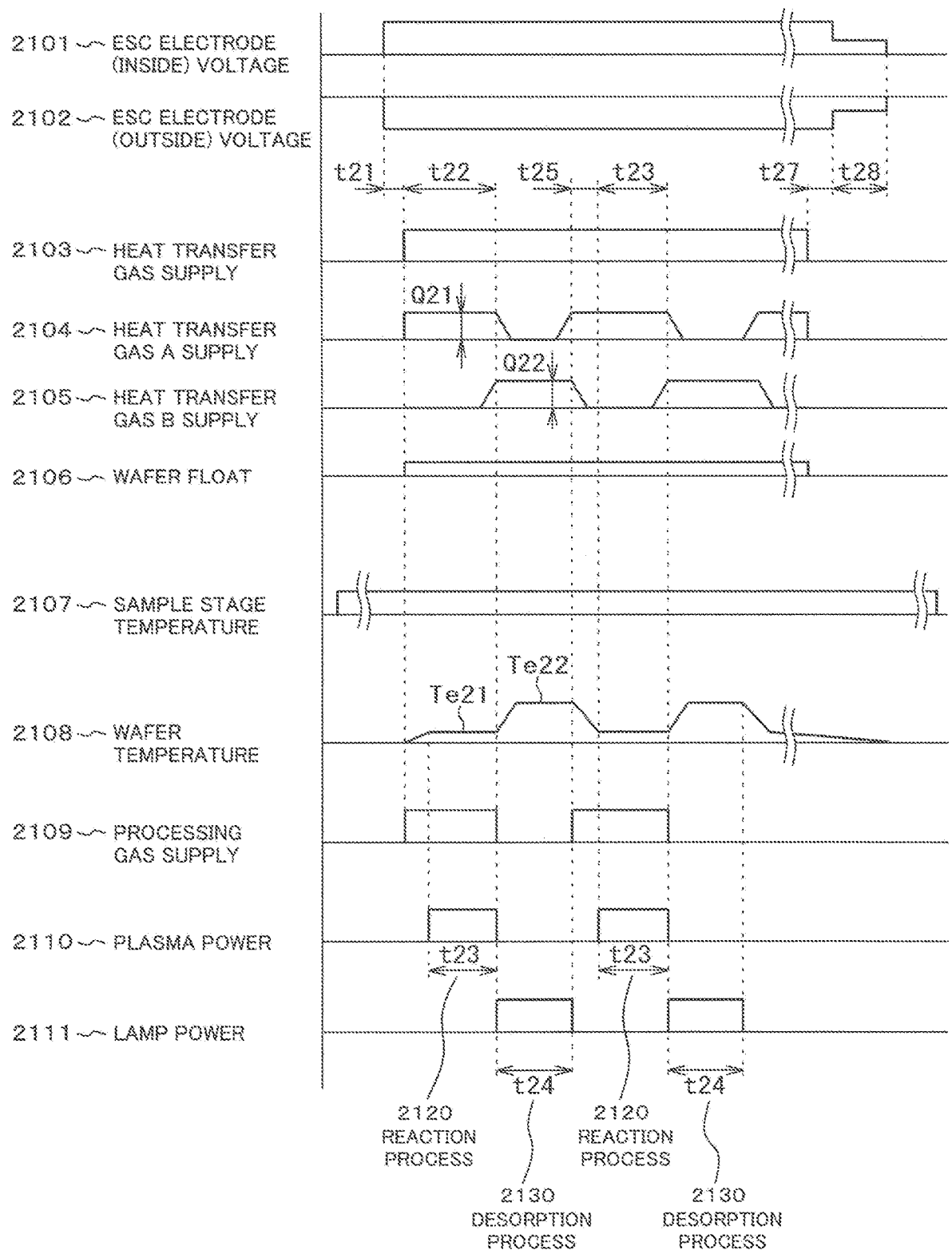
FIG. 21 is a time chart illustrating the operation of each part when the wafer processing apparatus according to the example illustrated in FIG. 20 processes the wafer.

FIG. 21 is a time chart illustrating the operation of each part when processing the wafer by the wafer processing apparatus according to this modified example illustrated in FIG. 20. In FIG. 20, the same reference numerals as those in FIG. 2 are members having the same constitution and explanation thereof is omitted.

In FIG. 20, two heat transfer gas supply devices 111 and 112 are connected to the heat transfer gas supply piping connected to the opening of the bottom surface of the sample stage 7*b* of the heat transfer gas supply passage 25 arranged inside the sample stage 7*b*. In this modified example, two heat transfer gases having different heat transfer rates supplied from the heat transfer gas supply devices 111, 112 are supplied to the heat transfer gas supply passage 25. Between the heat transfer gas supply devices 111 and 112 and the heat transfer gas supply passage 25, a gas reservoir 113 and a pressure control device 114 are connected in order from the heat transfer gas supply device side.

The sample stage 7*b* of this modified example is preferably used in the downflow type wafer processing apparatus illustrated in FIG. 15. The other configuration of the wafer processing apparatus having the sample stage 7*b* of this modified example is the same as that of the second example illustrated in FIG. 15, and the explanation will not be provided. In addition, in the description of this variation, the configuration not described in FIG. 20 will be described with reference to the configuration in the second example described in FIGS. 16 to 17.

The operation of the plasma processing apparatus including such a sample stage 7*b* will be described below. Similarly to the second example illustrated in FIG. 15, a DC voltage for electrostatic attraction is applied to the inner electrode 22 and the outer electrode 23 in the electrostatic chuck 21 (2101, 2102), and these electrodes and the wafer 8, the wafer 8 placed on the electrostatic chuck 21 of the sample stage 7*b* is electrostatically attracted and held by the electrostatic force. Thereafter, heat transfer gas is introduced into the heat transfer gas dispersion region 761 between the back side of the wafer 8 and the concave portion 21' on the upper side of the electrostatic chuck 21, and the wafer 8 floats above the upper side of the electrostatic chuck 21.

The heat transfer gas A, B supplied (2103) from each of the heat transfer gas supply devices 111, 112 has a heat transfer coefficient of the gas A larger than the gas B. These gases A and B flow through the pipe and flow into the gas reservoir 113 to be dispersed, and then introduced into the heat transfer gas supply passage 25. The pressure of the heat transfer gas that passes through the heat transfer gas supply passage 25 to be supplied to the back surface of the wafer 8 is adjusted to a predetermined pressure by a pressure control device 114 disposed between the gas reservoir 113 and the inlet of the heat transfer gas supply path 25 arranged on the bottom surface of the sample stage 7*b*.

When the heat transfer gas to be supplied to the wafer 8 is switched from A to B or B to A in accordance with the command signal from the control device 32, the flow rates of the heat transfer gases A and B introduced into the gas reservoir 113 Respectively. However, since the pressure control device 114 keeps the mixed gas of the heat transfer gas A, B supplied from the gas reservoir 113 at a constant pressure, the pressure of the heat transfer gas supplied to the back side of the wafer 8 is lower than the heat transfer gas, even if the type of the change is changed.

Therefore, even when the heat transfer gas supplied to the back side of the wafer 8 is switched, it is possible to prevent fluctuation of the height of the floating (2106) of the wafer 8. Particularly, in heat transfer gas properly selected according to the processing conditions applied to the wafer 8 is supplied to the back surface of the wafer 8, for example, a reaction step or a cooling step in which heat transfer between the wafer 8 and the sample stage 7*b* is better Heat transfer gas with larger heat transfer, in the heating step where less heat transfer between the wafer 8 and the sample stage 7*b* is better, by supplying heat transfer gas with small heat transfer, accuracy of processing and efficiency of processing can be improved.

In addition to simply switching to each of the heat transfer gases A and B and supplying it to the heat transfer gas dispersion region 761, by adjusting the flow rate or speed of each of the heat transfer gases A and B to be supplied to the gas reservoir 113, it is also possible to process the wafer 8 by adjusting the magnitude of the heat transfer between the wafer 8 and the electrostatic chuck 21 or the sample stage 7*b* to an arbitrary value within the range suitable for each processing step of the wafer 8.

The process flow of the wafer 8 in the plasma processing apparatus of this modified example will be described with reference to FIG. 21. FIG. 21 is a time chart illustrating the operation of each part when the wafer processing apparatus according to the example illustrated in FIG. 20 processes wafers.

Also in this modified example, similarly to the first example and the second example, the refrigerant having a value within a predetermined range in the refrigerant supply device 9 is supplied to the refrigerant flow passage 24 inside the sample stage 7*a* (Supply of heat transfer gas: 2103), while circulating between the refrigerant flow passage 24 and the refrigerant supply device 9 to set the temperature (2107) of the sample stage 7*a* to a temperature within a range suitable for processing, (ESC voltage (inside): 2101 and ESC voltage (outside): 2102) is applied to each of the inner electrode 22 and the outer electrode 23 which are electrostatic chucking electrodes for electrostatic attraction of the wafer 8.

The heat transfer gas A from the heat transfer gas supply device 111 is supplied to the heat transfer gas supply passage 25 at the flow rate Q21 after the time t21 from the start of supply of the electrostatic attraction voltage to the inner electrode 22 and the outer electrode 23 (Heat transfer gas A supply: 2104). The heat transfer gas A having the flow rate Q21 is directed in a specific direction around the center of the wafer 8 in the heat transfer gas dispersion region 761 between the back side of the wafer 8 and the upper side of the electrostatic chuck 21 through the heat transfer gas supply passage 25, and is dispersed to float the wafer 8 above the upper side of the electrostatic chuck 21 (2106) by applying an external force based on the upward pressure against the back side of the wafer 8.

The heat transfer gas A is supplied in a specific direction around the center of the wafer 8, while passing through the heat transfer gas seal region 751 between the wafer 8 on the outer circumferential side of the heat transfer gas dispersion region 761 and the electrostatic chuck 21, 610, and the wafer 8 is held in a non-contact manner, while being rotated by a balance between an electrostatic force attracting downward above the upper side of the electrostatic chuck 21 and an external force of the heat transfer gas A.

The temperature (2108) of the wafer 8 gradually approaches the temperature (2107) of the sample stage 7*b* by the supply of the heat transfer gas A (2103) and is held at a value within a range approximate to the temperature (2107) of the sample stage 7*b*. It is to be noted that a refrigerant at a predetermined temperature is supplied and circulated in advance to the sample stage 7*b*, and the temperature (2107) of the sample stage 7*b* is maintained at a value within a predetermined range. At the start time of the supply of the heat transfer gas A (2104), the processing gas from the processing gas source 68 is supplied (2109) into the plasma generation chamber 66. In this state, in the processing chamber 610, the wafer 8 floats above the upper side of the electrostatic chuck 21 and is held in a non-contact manner, and the processing gas is also supplied into the processing chamber.

When the controller 32 detects that the temperature (2108) of the wafer 8 has reached the first temperature Te21 suitable for the predetermined process, the high-frequency power (plasma power: 2110) for plasma generation is supplied to the induction coil 71 to ionize or dissociate the atoms or molecules of the processing gas to generate plasma 80 in the plasma generation chamber 66. Plasma treatment in which a reactive layer is formed on the surface of the wafer 8 is performed by interaction between highly active particles such as radicals of the formed plasma 80 and the film layer to be processed which is formed in advance on the upper side of the wafer 8. In this modified example, the supply of the induction coil 71 of the plasma power (2110) is performed for a time t23 and is stopped. That is, a reaction step 2120 for forming a reaction layer on the surface of the wafer 8 is performed for a time t23.

After the reaction step 2120 is performed for only the time t23, the supply of the processing gas from the processing gas source 68 to the plasma generation chamber 66 (2109) is also stopped together with stopping the supply of the plasma power (2110) to the induction coil 71. Further, the supply of the heat transfer gas A (2104) is started after a lapse of time t21 from the start of the supply of the voltages (2101 and 2102) for electrostatic adsorption to the inner electrode 22 and the outer electrode 23 and then is continued by the time t22 including the time t23 of the reaction step 2120. Further, the supply of the processing gas (2109) to the plasma generation chamber 66 is performed in accordance with the time t22 at which the heat transfer gas A is supplied (2104). The time t22 is set equal to or longer than the time obtained by adding the time t23 to the time required for the wafer 8 to reach the first temperature Te21.

After the reaction step 2120 is finished, a desorption step 2130 for releasing the reaction layer from the surface of the wafer 8 by heating the wafer 8 is performed for a time t24. At the start of the desorption step 2130, the heat transfer gas B is supplied from the heat transfer gas supply device 112 to the space between the electrostatic chuck 21 and the wafer 8 floating above the heat transfer gas supply passage (2105). After the start of supply (2105) of the heat transfer gas B, the flow rate of the heat transfer gas A is gradually decreased until it reaches 0.

In the present modified example, the supply (2105) of the heat transfer gas B is started slightly before the end of the reaction step 2120, and the flow rate of the heat transfer gas B is Q22 at the start of the desorption step 2130 so that it gradually increases during the reaction step 2120. These heat transfer gases A and B supplied in parallel in the reaction step 2120 are mixed in the gas reservoir 113 and thereafter adjusted to a predetermined pressure or flow rate in the pressure control device 114 to be transferred to the heat transfer gas supply passage 25 To the space between the back side of the wafer 8 and the concave portion 21' on the upper side of the electrostatic chuck 21. Therefore, variation of the distance (height of floating) of the wafer 8 from the upper side of the electrostatic chuck 21 is prevented as compared with a state in which only the heat transfer gas A is supplied.

That is, the ratio of the amount of the heat transfer gas B included in the unit flow rate of the heat transfer gas supplied to the gap between the wafer 8 and the electrostatic chuck 21 from the time before the end time of the reaction step 2120 is increased, the total flow rate of the mixture of the heat transfer gases A and B is increased and the pressure of the gap is maintained to be a value within a predetermined allowable range. Furthermore, the flow rate of the mixed heat transfer gas is reduced while the flow rate of the heat transfer gas A gradually decreases to 0 after the desorption step 2130 is started, while the pressure of the gap is lower than the predetermined pressure. The heat transfer gas supplied to the gap after a predetermined time after the desorption step 2130 is started is only the heat transfer gas B from the heat transfer gas supply device 112.

Electric power (lamp power: 2111) is supplied to the heating lamp 73 at the time when the reaction step 2120 is completed, and infrared rays are emitted from the heating lamp 73. Upon receiving the irradiation of the infrared ray, the upper side of the wafer 8 is heated and set in advance Is maintained at a value within an allowable range including a predetermined temperature (second temperature Te22) appropriate for the desorption step 2130, and a removal process of the reaction layer from the wafer 8 which is the desorption step 2130 is performed. Further, in the desorption step 2130, the heat transfer gas B having relatively poor heat transfer is supplied to the back side of the wafer 8, so that the wafer 8 is heated in a shorter time.

After the desorption step 2130 is performed for a preset time t42, the supply of the lamp power (2111) is stopped. The flow rate of the heat transfer gas B by the heat transfer gas B supply (2105) is maintained until the desorption step 2130 ends until the flow rate Q22 is maintained for the time t24.

Upon completion of the desorption step 2130, the control device 320 determines whether or not the processing of the film layer to be processed on the wafer 8 has reached the end point (corresponding to step S103 of the processing flow of FIG. 18), and when it is detected that the end point has not been reached, the wafer processing apparatus 1501 is adjusted so as to perform the reaction step 2120 again after performing the cooling step for the time t25. That is, after completion of the desorption step 2130, after the supply of the heat transfer gas A to the gap between the wafer 8 and the electrostatic chuck 21 at the flow rate Q21 is started, gradually decreasing until the flow rate of the heat transfer gas B becomes 0. The supply (2104) of the heat transfer gas A from the heat transfer gas supply device 111 to the gas reservoir 113 is started before the desorption step 2130 is finished, and is gradually increased during the desorption step 2130 so that the flow rate becomes Q 1 at the start of the cooling process at the time t25.

While the heat transfer gases A and B are being supplied in parallel, these heat transfer gases are mixed in the gas reservoir 113, thereafter adjusted to a pressure or flow rate within a predetermined range by the pressure control device 114, and is supplied to the space between the back side of the wafer 8 and the upper side of the electrostatic chuck 21 through the gas supply passage 25, and fluctuation of the flying height of the wafer 8 is prevented. During the process before the desorption step is completed, the ratio of the heat transfer gas A of the heat transfer gas to be supplied becomes high, is maintained at the flow rate Q1 from the cooling process start time at the time t25 and the flow rate of the heat transfer gas B is gradually reduced to 0, the heat transfer gas supplied to the gap between the back surface of the wafer 8 and the top surface of the electrostatic chuck 21 during the cooling step at the time t25 and the reaction step (2120) performed subsequently is made only of the heat transfer gas A.

In accordance with the stop of lamp power (2111) at the end of desorption step 2130, the supply of the processing gas (2109) from the processing gas source 68 to the plasma generation chamber 66 is started. In addition, by stopping the irradiation of infrared rays from the heating lamp 73 due to the stop of the lamp power (2111), the temperature (2108) of the wafer 8 decreases, and the cooling process is performed at the time t25, which is close to the set first temperature Te21. Since the heat transfer gas A having a high heat transfer coefficient is supplied to the gap between the wafer 8 and the electrostatic chuck 21 in the cooling step at the time t25, the efficiency of heat transfer between the sample stage 7b or the electrostatic chuck 21 and the wafer 8 is improved and the time t25 of the cooling process is shortened. In the present modified example, the temperature of the wafer 8 is set to the first temperature Te21 during the time t25.

When it is detected by the control device 321 using a temperature sensor (not illustrated) that the wafer 8 has been brought to the first temperature Te21, similarly to the reaction step 2120 described above, a high-frequency power (plasma power: 2110) for plasma generation is supplied to the induction coil 71 to form plasma 80 in the plasma generation chamber 66, the highly active particles in the plasma 80 and the film layer to be treated on the surface of the wafer 8 interact to generate a plasma process for forming a reaction layer on the film layer to be treated. The reaction step 2120 is performed only for a preset time t23 in the same manner as described above, and the supply of the plasma power (2110) is stopped and the plasma is stopped by the command signal transmitted from the control device 320 which detects that the time t23 has elapsed (2109) of the processing gas to the generation chamber 66 are synchronously stopped.

The supply (2104) of the heat transfer gas A at the flow rate Q21 when performing the next reaction step 2120 after the desorption step 2130 of the present modified example is the sum of the time t25 of the cooling step and the time t23 of the reaction step 2120, and is performed only from the start time of the cooling process at time t25 to the end time of the reaction process 2120. That is, in this example, after the first reaction step 2120 after the processing of the wafer 8 is started, at the time t24, the desorption step 2130 in which the heat transfer gas B flows at the flow rate Q2, and the cooling step and the reaction step 2120 at the time t25 at which the heat transfer gas A is supplied at the flow rate Q21 for the total time of the times t25 and t23 is repeated, the processing steps of the film layer to be processed by the combination of the reaction step 2120 and the desorption step 2130 are performed until a predetermined number of times or until reaching the processing end point by the control device 320.

When the cooling process at the last time t25 is performed and the arrival at the end point of the processing of the wafer 8 is detected by the control device 321, in the same way as in the above embodiment, the supply (2103) of the heat transfer gas A is stopped in response to the command signal from the control device 321, the wafer 8 descends from a predetermined height position above the top surface of the electrostatic chuck 21 and comes into contact with and is attracted to be held. Furthermore, after the time t27, the voltage values of the electrostatic chucking voltages (2101 and 2102) supplied to the inner electrode 22 and the outer electrode 23 are lowered or polarities opposite to those during the processing of the wafer 8 are added, a step of charge elimination for reducing and removing static electricity formed on the electrostatic chuck 21 is performed for only time t28, and the application of the electrostatic chuck-ing voltages (2101 and 2102) is stopped. In this state, detachment of the wafer 8 from the sample stage 7b becomes possible.

In this modified example in which the supply of the heat transfer gas A, B is switched, a configuration in which a gas reservoir 113 and a pressure control device 114 are provided on the supply path between the heat transfer gas supply path 25 and the heat transfer gas supply devices 111 and 112 in the sample stage 7b, and switching of the heat transfer gas is performed, while preventing the fluctuation of the pressure of the heat transfer gas and the position of the flying height of the wafer 8 is exemplified, a configuration may be adopted in which heat transfer gas is switched from one to the other using a waste gas line. That is, a waste gas line is provided between the heat transfer gas supply devices 111, 112 and the heat transfer gas supply passage 25, and while at least one of the heat transfer gas is not supplied to the gap between the wafer 8 and the electrostatic chuck 21, the heat transfer gas is discarded and introduced into the gas line and discharged outside the wafer processing apparatus, and thus, heat transfer gas with a flow rate within a predetermined range may be supplied to the heat transfer gas supply path 25.

In this configuration, the valves disposed on the gas supply paths connected to the heat transfer gas supply devices 111 and 112 and the heat transfer gas supply path 25 and the waste gas line are switched in accordance with command signals from the control device 321, and it is possible to switch the heat transfer gas A, B to be supplied to the gap between the wafer 8 and the electrostatic chuck 21

As described above, in the present modified example, while the reaction step 2120 and the desorption step 2130 are repeated, in a state where the wafer 8 is floated above the electrostatic chuck 21, the type of heat transfer gas to be supplied to the lower surface of the wafer 8 is switched between the reaction step 2120 and the desorption step 2130.

According to Modified Example 1 described above, the wafer 8 floating above the upper side of the electrostatic chuck 21 above the sample stage 7b and kept in a non-contact manner is irradiated with infrared rays from the heating lamp 73 and heated to heat the reaction layer is carried out. In addition, the efficiency of heat transfer by the heat transfer gas is increased in a state in which the wafer 8 is floated and held in a non-contact manner, and the temperature of the wafer 8 is reduced. Therefore, even when there is a difference in the magnitude of thermal expansion between the wafer 8 and the electrostatic chuck 21, sliding of the back side of the wafer 8 is reduced, and damage or wear and particle generation are prevented.

Since the heat transfer gas having a different heat transfer coefficient is switched and supplied to the gap between the wafer 8 and the electrostatic chuck 21 in accordance with the conditions of different processes for processing the film layer to be processed of the wafer 8, the efficiency of adjusting the temperature is improved and the time required for adjusting the temperature is shortened. Thus, the throughput of the processing of the wafer 8 can be improved.

Second Modified Example

In the example, by using the heat transfer gas discharge path 28 having the same configuration as the sample stage 7 shown in FIG. 2 for the wafer processing apparatus 1501 according to the second example or the first modified example shown in FIGS. 15 to 21, the outflow of the heat transfer gas into the processing chamber is reduced, the influence of the heat transfer gas on the processing result of the wafer 8 is prevented, and the processing yield is improved. The second modified example will be described with reference to a flowchart illustrated in FIG. 22.

Figure 22:
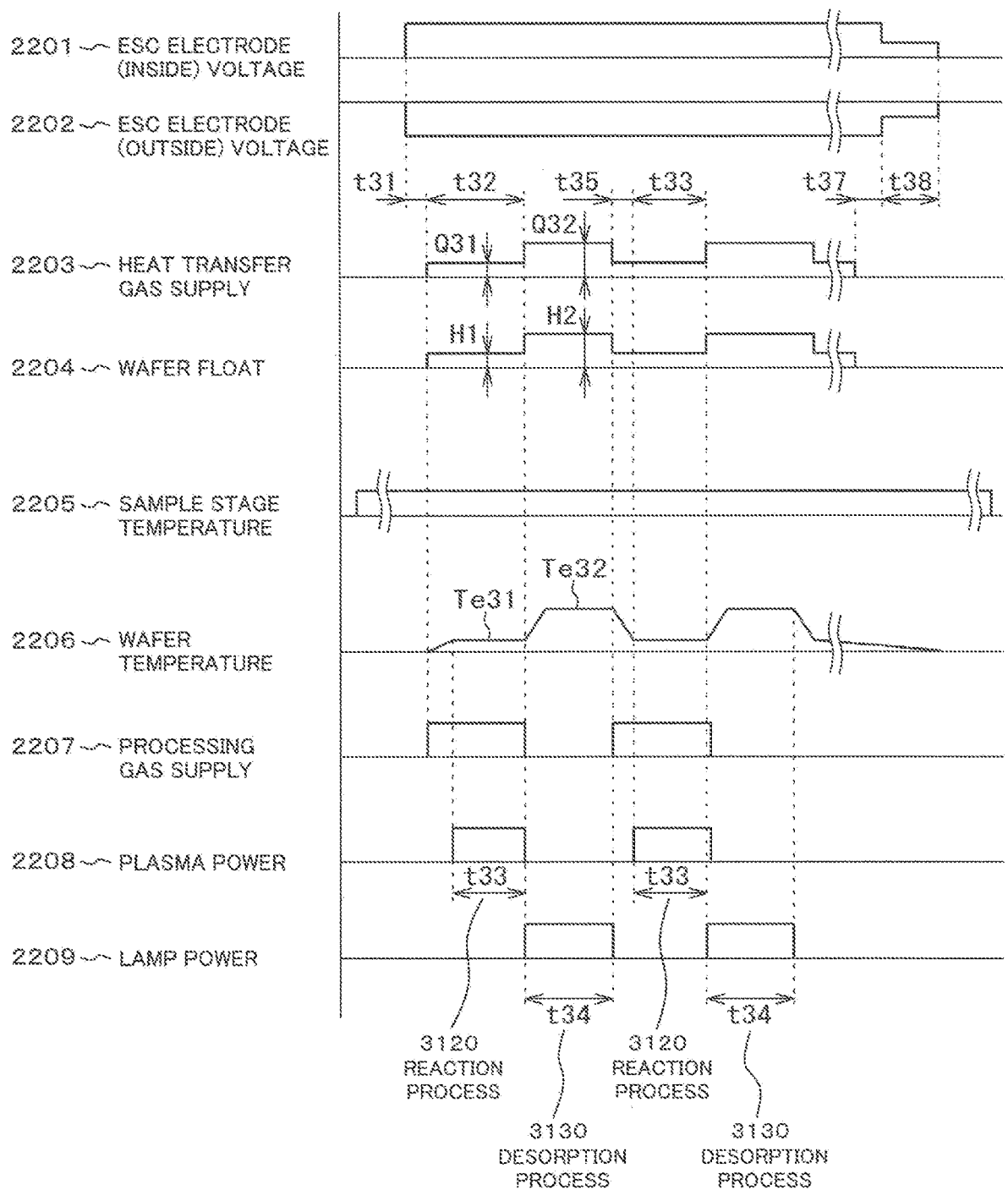
FIG. 22 is a time chart illustrating the operation of each part with the lapse of time when the plasma processing apparatus according to another modified example of the example illustrated in FIG. 15 processes the wafer in accordance with the flowchart of FIG. 18.

The time chart illustrated in FIG. 22 is a time chart of the wafer processing apparatus 1501 according to the second example illustrated in FIG. 15 when processing wafers according to the flowchart illustrated in FIG. 18, and the operation of each part in accordance with the operation.

The wafer processing apparatus according to the present modified example is obtained by replacing the sample stage 7 illustrated in FIG. 2 in the example with the sample stage 7a of the wafer processing apparatus 1501 illustrated in FIG. 15 in the second example. Since the configuration of the other parts of the wafer processing apparatus is the same as that of the wafer processing apparatus 1501 described in the second example with reference to FIGS. 15 to 17, the description thereof will not be provided. In the following description, the configuration of the sample stage 7 described with reference to FIG. 2 in the example and the configurations and flowcharts illustrated in FIGS. 15 to 18 explained in the second example will be used with diversion.

In FIG. 22, first, as in the case of the second example, the wafer 8 is carried into the processing chamber 610 inside the processing container 61 and transferred to the lift pins 33 illustrated in FIG. 8 in the example above the sample stage 7 and is placed on the upper side of the electrostatic chuck 21 by the descent of the lift pins 33. Thereafter, DC voltages (2201 and 2202) for imparting different polarities are applied to the inner electrode 22 and the outer electrode 23 inside the electrostatic chuck 21 at a predetermined time.

The heat transfer gas is supplied (2203) to the gap between the electrostatic chuck 21 and the wafer 8 at a flow rate Q31 through the heat transfer gas supply passage 25 after a time t31 from the start of the application of the DC voltage (2201 and 2202). As in the case of the first embodiment shown in FIG. 2, the refrigerant which has been brought to a temperature within a predetermined range in the refrigerant supply device 9 before the wafer 8 is placed in the refrigerant flow passage in the sample stage 7 is (2205) is controlled by being supplied and circulated between them.

The wafer 8 receives an upward force due to the pressure of the heat transfer gas generated by the heat transfer gas supplied at the flow rate Q31 to the heat transfer gas dispersion region 760 which is the gap between the wafer 8 and the electrostatic chuck 21, (Wafer floating: 2204) above the upper side of the chuck 21 and held at a height H1 from the upper side in a non-contact manner. Further, since the heat transfer gas is supplied (2203) to the gap between the wafer 8 and the electrostatic chuck 21, the temperature (2206) of the wafer 8 is gradually brought close to the temperature of the sample stage 7 and is heated to a certain first temperature Te31 which is approximated to this value.

At the time when the supply of the heat transfer gas (2203) is started, the supply of the processing gas from the processing gas source 68 to the plasma generation chamber 66 (2207) is started. The control device 320 that receives the output from the temperature sensor (not illustrated) that the wafer 8 reaches the first temperature Te31 (actually, the control device in this modified example is different from the control device 320 described in the second example, but, for the sake of convenience, this is also referred to as the control device 320), in accordance with a command signal from the control device 320, high-frequency power (plasma power: 2208) for plasma generation is supplied to the induction coil 71, and plasma is generated from atoms or molecules of the processing gas in the plasma generation chamber 66.

High-activity particles or charged particles in the plasma move to the lower processing chamber 610, and plasma processing is performed in which a reaction layer is formed on the film layer to be processed on the surface of the wafer 8. The plasma process is performed for a predetermined time t33 when the plasma power 2208 is supplied, and the supply of the processing gas (2207) is also stopped along with the supply of the plasma power (2208).

The time t32 for supplying the heat transfer gas at the flow rate Q31 is set to be equal to or longer than the total time of the time required for the wafer 8 to reach the first temperature Te31 and the time t33. Further, in this case, the supply of the processing gas (2207) is performed in accordance with the supply time t32 of the supply of the heat transfer gas (2203).

When the control device 320 detects that the reaction process has ended after a time t33 has elapsed since the supply of the heat transfer gas (2203) is started, a command signal is transmitted so as to increase the amount of the heat transfer gas in the heat transfer gas supply (2203) to Q32. The flying height above the upper side of the electrostatic chuck 21 of the wafer 8 (2204) is increased to H2 by the supply of the heat transfer gas (2203) whose flow rate has increased from Q31 to Q32 and is held at the height position.

In accordance with the time when the flow rate of the heat transfer gas in the heat transfer gas supply (2203) is set to Q32, alternatively, after the flying height of the wafer 8 is made H2, power (lamp power: 2209) is supplied to the heating lamp 73 in accordance with a command signal from the control device 320. Therefore, the infrared rays radiated from the heating lamp 73 are irradiated onto the upper side of the wafer 8 through the top plate 64 having a light-transmitting property, and the wafer 8 is heated to release the reaction layer on the film layer to be treated (3130: corresponding to steps S99 and S100 illustrated in the flowchart of FIG. 18 in the second example) is started. As the flying height of the wafer 8 has increased to H2, the heat transfer between the wafer 8 and the electrostatic chuck 21 is reduced and the temperature rise (change from Te31 to Te32) by the heating lamp 73 occurs in a short time.

During the desorption step (3130), the wafer 8 is maintained at a predetermined constant temperature (second temperature: Te32) suitable for desorption of the reaction layer. The desorption step (3130) is performed for a preset time t34 from the start of heating of the wafer 8 by the heating lamp 73, and when the elapse of the time t34 is detected in the control device 320, in accordance with the command signal from the control device 320, the supply of the lamp power (2209) is stopped, and the detachment step (3130) ends.

Upon completion of the desorption step (3130) or during the period of desorption step (3130), the control device 320 determines whether or not the processing of the film layer to be processed has reached the end point at predetermined time intervals. If it is determined that the end point has not been reached, a command signal for restarting the supply (2207) of the processing gas to the plasma generation chamber 66 is transmitted in accordance with the stop of the lamp power (2209). At the same time, the flow rate of the heat transfer gas in the heat transfer gas supply (2203) is adjusted to decrease to Q31.

With this operation, the non-contact height position above the upper side of the electrostatic chuck 21 of the wafer 8 is reduced to H1, the heat transfer between the sample stage 7 and the wafer 8 increases, the heating by the heating lamp 73 is stopped with the stoppage of the lamp power (2209), the temperature (2206) of the wafer 8 lowers from Te32 to Te31, and the cooling step is performed at a time t35 after the end of the desorption step 3130 at a time t35 at which the temperature decreases to the first temperature Te31 or a temperature close to the first temperature Te31. In this modified example, the time during which the heat transfer gas at the heat transfer gas supply (2203) is supplied at the flow rate Q32 and the wafer 8 is held at the height H2 is equal to the time t34 of the desorption step (3130).

When the control device 320 detects that the temperature of the wafer 8 has reached the first temperature Te31 or a value close to the first temperature Te31, similarly to the reaction step (3120) performed previously, the control device 320 causes the induction coil 71 to generate plasma (plasma power 2208) and supplies the processing gas to the plasma generation chamber 66 (2207), and the wafer plasma processing for forming the reaction layer on the upper side of the wafer 8 is performed again. This reaction step (3120) is also carried out for the time t33 in the same way as in the previous reaction step, and the supply of the processing gas (2207) is also stopped together with the supply stop of the plasma power (2208).

In the present modified example, when the next reaction step (3120) is performed after the desorption step (3130), the time during which the heat transfer gas is supplied (2203) at the flow rate Q31 is shorter than the time t35 of the cooling step and the time t33 of the reaction step (3120). That is, in the subsequent desorption step (3130) and reaction step (3120), except for the first reaction step (3120) when the processing of the wafer 8 is started, the heat transfer gas in the heat transfer gas supply (2203) is repeated until the main point of the process is reached at the flow rate Q32 at the time t34, at the flow rate Q31 at the time t33+t35.

When the last cooling step is performed and the end of the processing of the wafer 8 is detected, the supply (2203) of the heat transfer gas to the heat transfer gas supply passage 25 is stopped, the wafer 8 descends from the upper position of H2 on the top surface of the electrostatic chuck 21 and is placed on the electrostatic chuck 21 and adsorbed and held. Thereafter, after the time t37, the DC voltage (2201 and 2202) applied to the inner electrode 22 and the outer electrode 23 is lowered or a step of applying a voltage to which a polarity opposite to that during the treatment is applied is performed. The application of the DC voltage (2201 and 2202) to the inner electrode 22 and the outer electrode 23 is stopped after time t38 from the start of this neutralization step. As a result, the wafer 8 can be detached from the sample stage 7.

As described above, in the present modified example, by changing the flow rate of the heat transfer gas supplied to the back side of the wafer 8 in the reaction step 3120 and the desorption step 3130, the floating amount of the wafer 8 with respect to the electrostatic chuck 21 is changed, and thus, the temperature of the wafer 8 in the reaction step 3120 and the desorption step 3130 is controlled.

Also in this modified example, sliding of the back side of the wafer 8 is reduced even when there is a difference in the magnitude of thermal expansion between the wafer 8 and the electrostatic chuck 21, as in the second example. Damage or wear, or occurrence of particles is prevented. Further, the efficiency of adjusting the temperature of the wafer 8 is improved, and the time required for adjusting the temperature is shortened. Therefore, the throughput of the processing of the wafer 8 is improved.

Although the wafer processing apparatus according to the above-described examples and modified examples has the configuration of generating inductively coupled plasma, the configuration for generating plasma is not limited thereto, and the capacitance coupling type or a plasma generation system of an electrodeless system may be used. Further, the configurations of the wafer processing apparatus and the wafer processing method of these examples and modified examples described above are not limited to the examples, but can be combined and changed.

What is claimed is:

1. A method of processing a wafer in which a process target wafer is placed on a sample stage disposed in a processing chamber inside a vacuum chamber, the method comprising:
   supplying an electric field from a high-frequency power supply into the vacuum chamber to form plasma using processing gas introduced into the vacuum chamber from a processing gas supply unit;
   while causing a refrigerant supplied from a refrigerant supply device to a refrigerant flow passage disposed inside the sample stage to circulate, holding the wafer on an electrostatic chuck disposed on an upper portion of the sample stage and including a central portion formed in a concave shape with respect to a peripheral portion thereof to attract the wafer by an electrostatic force;
   while supplying a plurality of heat transfer gases having thermal conductivity from the heat transfer gas supply unit between the wafer and the central portion formed in the concave shape of the electrostatic chuck unit from a plurality of openings arranged on a top surface of the electrostatic chuck unit, processing the wafer according to a plurality of processes comprising a reaction step and a desorption step; and
   in the plurality of processes, controlling the heat transfer gas supply unit to adjust the amount or pressure of at least one of the plurality of heat transfer gases introduced from the opening in a state in which the wafer is held above the electrostatic chuck unit in a non-contact manner to adjust the height of or a pressure in a gap between the wafer and the top surface of the electrostatic chuck unit to a predetermined value of in the plurality of processes, thereby processing the wafer, while controlling the temperature of the wafer depending on the plurality of processes for processing the wafer,
   wherein each of said plurality of heat transfer gases has a respectively different heat transfer rate.

2. The method according to claim 1, wherein
   the plurality of processes for processing the wafer while controlling the temperature of the wafer by the control unit include a step of forming the electric field by the high-frequency power supply to form a reaction layer on the surface of the wafer using the plasma generated inside the processing chamber, and a step of heating the wafer by a heating unit to desorb the reaction layer.

3. The method according to claim 2, wherein
   in the step of heating the wafer by the heating unit to desorb the reaction layer, the wafer placed on the electrostatic chuck unit is heated from above the wafer by a first heating lamp unit of the heating unit, and heating the wafer placed on the electrostatic chuck unit by a second heating lamp unit of the heating unit in the vicinity of the outer circumferential portion of the wafer.

4. The method according to claim 1, wherein
   the heat transfer gas supply unit is controlled by the control unit to control the temperature of the wafer, by switching the flow rate of the plurality of heat transfer gases flowing out of the plurality of openings between the central portion formed in the concave shape of the electrostatic chuck unit and the wafer placed on the electrostatic chuck unit to cause the wafer to float from the electrostatic chuck unit, and by changing a floating amount of the wafer from the electrostatic chuck unit, depending on the plurality of processes for processing the wafer.

5. The method according to claim 1, wherein
the heat transfer gas supply unit is controlled by the control unit to control the temperature of the wafer, by switching a type of at least one of said plurality of heat transfer gases flowing out of the plurality of openings between the central portion formed in the concave shape of the electrostatic chuck unit and the wafer placed on the electrostatic chuck unit depending on the plurality of processes for processing the wafer.

* * * * *